(12) United States Patent
Armstrong

(10) Patent No.: US 6,208,271 B1
(45) Date of Patent: *Mar. 27, 2001

(54) REMOTE CONTROLLER WITH ANALOG BUTTON(S)

(76) Inventor: Brad A. Armstrong, P.O. Box 1419, Paradise, CA (US) 95967

(*) Notice: Subject to any disclaimer, the term of this patent is extended or adjusted under 35 U.S.C. 154(b) by 0 days.

This patent is subject to a terminal disclaimer.

(21) Appl. No.: 09/148,806

(22) Filed: Sep. 4, 1998

(51) Int. Cl.$^7$ .................................................. H03K 17/94
(52) U.S. Cl. .............................. 341/34; 341/22; 341/176; 345/159; 345/169; 200/511
(58) Field of Search ............................ 341/22, 34, 176; 345/174, 169, 159; 200/511, 512, 515

(56) References Cited

U.S. PATENT DOCUMENTS

| | | |
|---|---|---|
| 3,806,471 | 4/1974 | Mitchell . |
| 4,315,238 | 2/1982 | Eventoff . |
| 4,866,542 | 9/1989 | Shimada et al. . |
| 5,670,955 * | 9/1997 | Thorne, III et al. ................. 341/34 |
| 5,943,044 * | 8/1999 | Martinelli et al. ................. 345/174 |
| 5,995,026 * | 11/1999 | Sellers ................................ 341/34 |

* cited by examiner

Primary Examiner—Michael Horabik
Assistant Examiner—Timothy Edwards, Jr.

(57) ABSTRACT

A remote controller for controlling a host device, the controller including a housing, an electrical power source within the housing, electronic circuitry within the housing connected to the power source and including a radiation emitter to emit signals from the housing, a plurality of finger depressible buttons exposed on the housing and interfacing with sensors electrically associated with the circuitry. The buttons are for user selection of signals emitted for controlling a host device. At least some of the sensors are utilized only as momentary-On only On/Off sensors. At least one sensor(s) is a pressure-sensitive analog sensor structured for varying electrical conductance through at least three readable states or values. The readable states are dependant upon depressive pressure applied to the sensor(s) through finger depressible button(s). The circuitry is structured to read the readable states of the pressure-sensitive analog sensor(s) and to emit signals representing the state or value of the sensor(s). In one embodiment, the analog sensor(s) is/are elastomeric dome-cap sensor(s) including pressure-sensitive variable-conductance material positioned over proximal circuit elements of the circuitry. The analog sensors are preferably associated with selectable functions such as tuner channel changing as for televisions and supportive tuner devices, and video speed controls as for VCRs, DVDs and like recorded video players, and computers and audio and other like devices. Additionally disclosed are methods of use and manufacture.

31 Claims, 14 Drawing Sheets

PRIOR ART    Fig. 19

REMOTE CONTROLLER WITH ANALOG BUTTON(S)

BACKGROUND OF THE INVENTION

1. Field of the Invention

The present invention relates to hand-held electronic remote controller or remote commander devices such as are used to control host devices such as televisions, video players, audio players and cable boxes, and the like.

2. Description of the Related Prior Art

Prior art hand-holdable remote controllers for remotely controlling host devices such as televisions, cable boxes and satellite receivers therefor, video and audio players and the like have been used for many years. A typical prior art remote controller comprises a housing usually small enough to hold in a single hand. With wireless hand-held remote controllers, by far the most common today, a battery power source is contained within the housing. Wireless remote controllers are most commonly used directly or indirectly for controlling televisions, video and audio players due to the added convenience and safety of not having an electrical cord extending from the remote controller to the host device and one which a person could trip over. Within the typical remote controller housing is an electrical power source connected to electronic circuitry. The circuitry is for generating specific function-control signals for instructing the host device to perform a desired function. A radiation emitter, most commonly an infrared light emitter, is supported by the housing and connected to the circuitry to be controlled thereby. The radiation emitter, from one viewpoint, is typically considered a part of the circuitry. The radiation emitter emits radiation representative of or carrying a function-control signal from the circuitry of the remote controller to the host device. Exposed on the exterior of the housing is a plurality of finger depressible buttons which interface with momentary-On sensors of the controller. The momentary-On sensors are simple On/Off switches which assume a normally off or open position, and which interface between the exposed buttons and the circuitry of the remote controller. The momentary-On sensors typically are positioned between the exposed button portions and the circuitry which is typically on a circuit board. As will be detailed, the exposed portions of the buttons are often integral components of the sensors, or at least can be viewed as such particularly when elastomeric dome-caps sensors are employed. The exposed buttons allow interfacing of a human digit such as a finger or thumb with the electrical switches to close the switches in order to control the circuitry to actuate (or deactuate) a function of the host device via a function-control signal released electronically in the circuitry and sent via the radiation emitter to the host device. Typically each push button is associated with the circuitry such that each button is associated with only one of many function-control signals which the remote controller can output, and this explains the many buttons commonly on prior art remote controllers.

As those skilled in the art understand, host devices structured for remote control include a control-function signal receiver and circuitry for reading and processing the received control-function signals from the remote control, and for acting upon a received signal.

Host devices such as televisions, satellite receiver tuners or cable boxes for televisions and VCRs and DVDs which include tuners for selecting channels and which are structured for remote control, typically function with remote controllers which include a depressible channel-up button for scrolling or tuning upward through the channels at a predetermined rate for as long as the button is depressed, and a separate channel-down button for scrolling or tuning downward through the available channels at a predetermined rate as long as the button is depressed. When the channel-up or channel-down button is depressed, a function-control signal is sent from the remote controller to the host device, and is repeated at a predetermined rate until the depression of the button is released. The specific function-control signal, typically being a repeating digital bit stream, is such that it contains information which informs the host device as to which button is depressed, i.e., channel up or down, and the host device initiates the requested action. If the requested action is to move upward through the available channels, scrolling upward through the channels occurs for as long as the button is depressed, and the rate of scrolling is a predetermined rate. If the channel scroll down button is depressed by the user, the scrolling downward through the channel occurs for as long as the button is depressed, and the rate of downward scrolling is also a predetermined rate.

Due to the predetermined rate channel scrolling, it can require an excessive amount of time to scroll from one end of the available channels to the other end, for example, from channel 100 up to channel 555. Also, if the predetermined rate of scrolling through the channels is excessively high, it becomes difficult to stop at a particular desired channel. Therefore, many remote controllers of the type allowing channel selection, particularly those for control of televisions and associated equipment, include a keypad comprising a plurality of depressible buttons, the buttons each having an assigned number usually printed on the button, with ten buttons typically being used and each button assigned a number from 0 up to 9. A button assigned 1 can be pressed to call for channel 1, or pressed, and followed within a pre-determined brief time frame by the pressing of a 0 button to in effect call for channel 10. The 2 button pushed by itself calls for channel 2, while the 9 button calls for channel 9, and the 8 button pressed and followed by pressing the 7 button within a brief time frame calls for channel 87 as those skilled in the art as well as users of such remotes understand. With some remote controllers, pressing three channel buttons in a short interval can be used to select channels in the 100s, e.g. pressing 2 and then 3 and then 6 within an alloted time interval calls for channel 236. This procedure is at best awkward to many users.

In some prior art remote controllers associated with television channel selection, particularly modern high channel count receivers, the channel scrolling buttons when depressed to close the switch provide more than one predetermined rate scrolling speeds, i.e., when the button is first depressed, channel changing is slow, and with continued depression of the button over time, high scrolling speeds are obtained. Such multiple predetermined rate scrolling speeds are selected based on how long the normally open momentary-On switch associated with the channel up or down scrolling button has been closed. For example, if a user depresses and holds down the channel scroll up button, scrolling begins at a first predetermined rate which is relatively slow, and within a pre-determined period, a counter in the electronics of the host device initiates the electronics to utilize a second and faster predetermined rate of scrolling through the channels. Upon the scroll up button being released, the associated system stops scrolling and resets. Subsequent depression and holding of the scroll up button again requires the first predetermined rate to first be initiated and be held for a period of time, after which the second and faster predetermined rate of scrolling is automatically initiated. While this multi-speed predetermined rate scrolling arrangement might be considered an improvement over a single predetermined rate channel scroller, there are still shortcomings. One clear problem is that there is no ability to gradually slow down the predetermined high scroll rate. The resulting excessive scrolling speed near a desired channel renders it difficult to stop scrolling on the desired channel. Additionally, while the user can scroll through many channels quickly, and then release the scroll button prior to reaching the desired channel, the scroll button will again need to be depressed to advance further toward (or backward to) the target channel, such depression if held too long automatically engages the second faster predetermined scroll speed and rendering it again difficult to stop precisely on the target channel.

Another shortcoming of such remote controllers providing multiple predetermined channel scroll rates related to time of button depression is the significantly long time delay required to shift from a low rate to a high rate of scrolling. Many users choose to use the number keypad for individual channel input rather than wait the time required for the scroll rate to increase. Use of the keypad is less than an optimum solution.

At least one prior art remote controller for the high end Panasonic Omnivision SVHS VCR employs, in addition to having many momentary-On switches (depressible buttons), a rotary knob linked to a rotary encoder or potentiometer coupled to the internal circuitry and used for outputting a signal via the radiation emitter to the VCR to variably control video speeds such as fast forward or reverse search modes, or the playback rate of the slow motion mode. Additional rotary knob function control technology for a remote controller or commander is taught in U.S. Pat. No. 4,866,542, assigned to Sony Corp. of Tokyo, Japan, and issued Sep. 12, 1989 and reissued as U.S. patent RE35343 Oct. 1, 1996. While an encoder or potentiometer can be used to control the rate of play of a recorded video in forward or reverse directions, and for controlling certain other functions such as channel selection, encoders and poteniometers are relatively expensive and physically large compared to a typical prior art On/Off depressible button switch of the type used in all such remote controllers. Additionally, in order to function well with a human digit, i.e., finger or thumb, a rotary knob is best sized substantially larger than a depressible button, which leads to the controller being physically larger. Furthermore, a rotary encoder or potentiometer requires the user to apply a rotary force to the knob, and this is a completely different action than the normal, familiar and desirable push button action associated with all or most user interfaces on a hand held remote control commander. Most users of single hand remote controllers can master use of the controller with only one hand, grasping the housing to hold the remote and using either a thumb or finger of the grasping hand to depress the desired buttons. While some can master using a rotary knob on a remote controller in a similar single hand operation, most users find it easier to utilizes both hands, one holding the housing and with the other hand rotating the knob.

The vast majority of prior art remote controllers, particularly those used with consumer electronics, employ only depressible buttons associated only with momentary-On switches interfacing with the electronics of the remote controller. The vast majority of remote controllers having a plurality of momentary-On switches and associated depressible buttons utilizing elastomeric injection molded dome-cap type momentary-On switches, and most commonly with a plurality of dome-cap switches held in close proximity to one another in a connected sheet integrally molded with the dome-caps. Elastomeric molded dome-cap momentary-On switches (sensors) are well known and widely used in the prior art as switches incorporated in such devices as remote controllers for televisions and stereos, and in electronic game remote control devices, and some computer keyboards, etc. In all of the above mentioned devices and in all known prior art where the elastomeric dome-cap sensor is employed, the molded dome-cap is always used as a component of a sensor having a single threshold serving as a simple make or break (closed or open) electrical switch in a circuit.

The term elastomeric is used to describe any rubber-like material, whether natural or synthetic.

Structurally, the prior art elastomeric injection molded dome-cap carries a normally raised conductive element or disk referred to as a pill or a carbon pill. The conductive pill is herein sometimes referred to as the "active element". The active element in prior art elastomeric injection molded dome-cap sensors is commonly made of a binder of elastomeric or rubbery material binding carbon or carbon containing material and possibly other materials. The active element is located at the top inside of the non-conductive elastomeric dome-cap and above two proximal highly conductive elements or traces so that with depression of the dome-cap, such as with pressure applied by a finger, the active element is moved with the collapsing dome-cap into contact with both proximal conductive elements and closes an otherwise normally open circuit. Since the injection molded dome-cap is resilient, with release of pressure on the dome-cap it returns to a raised position carrying the active element with it to open the circuit. Electronic circuitry associated with the two proximal conductive elements, which are either bridged or not bridged by the active element of the elastomeric dome-cap, is circuitry which in the prior art has always been structured only to detect or read a threshold event, i.e., an open or closed, only On/Off states across the proximal conductive elements.

As those skilled in the art appreciate, most, but not all elastomeric injection molded dome-caps when depressed produce a soft snap, break-over, which is a user discernable tactile feedback. This tactile feedback occurs when the dome-cap is depressed beyond a given point; the point being where a mechanical threshold is crossed and the tactile "snap" is produced. The snap defining the tactile sensation occurs just prior to the active element being brought into contact with the two proximal conductive elements. The tactile sensation is perceived by the user as occurring at the same time the sensor is activated, which in the prior art is when the switch is closed. The switch remains closed until such time as the user releases pressure on the dome-cap, at which time the dome-cap being made of elastomeric material returns to a raised position carrying the active element with it and off of the proximal conductive elements. The elastomeric injection molded dome-cap typically again produces a tactile sensation as it moves upward crossing the mechanical snap-through threshold. Elastomeric injection molded dome-caps are typically molded primarily of thermoset rubber, are one-piece absent joints or seams, and provide excellent durability for a very low cost. The active element in the prior art is typically adhered to the inside top of the dome-cap during the injection molding phase of manufacturing the dome-cap.

Another type of prior art sensor, not known to be used in remote controllers, is described in U.S. Pat. No. 3,806,471 issued Apr. 23, 1974 to R. J. Mitchell for "PRESSURE RESPONSIVE RESISTIVE MATERIAL". Mitchell describes sensors which utilize pressure-sensitive variable-conductance material to produce analog outputs. Mitchell does not use or suggest an elastomeric injection molded dome-cap used to either carry variable-conductance material or to transfer finger applied pressure into variable-conductance material. Mitchell also fails to recognize any need for or suggest the use of an elastomeric injection molded dome-cap to provide tactile feedback to the user upon actuation or de-actuation of the pressure-sensitive variable-conductance sensor. U.S. Pat. No. 4,315,238 issued Feb. 9, 1982 to F. Eventoff describes a pressure-sensitive bounceless switch absent a suggestion of using an elastomeric injection molded one-piece dome-cap or providing tactile feedback, and is thus considered to be cumulative prior art to the Mitchell disclosure. Both Mitchell and Eventoff fail to suggest use of pressure-sensitive variable-conductance sensors or pressure-sensitive variable-conductance material in a remote controller, or in a dome-cap or any sensor embodiment supplying tactile feedback, and applied to a remote controller of a host device such as a television or recorded video player, etc., and in association with circuitry structured for control or manipulation by the elastomeric dome-cap sensor applied as an analog sensor.

Clearly, prior art remote control devices fail to deliver optimum user control of highly ubiquitous consumer electronic devices. Prior art remote control devices fail to deliver user determinable channel rate control. Prior art remote control devices also fail to deliver user determinable variable video rate control in a low cost, ergonomic, familiar and desirable depressible button format.

SUMMARY OF THE INVENTION

The present invention, in one preferred form, is an improved hand-holdable remote controller for providing a human user increased control over a remotely controllable host or parent device. The present improved remote controller utilizes compression or pressure-sensitive variable-conductance analog sensors in place of some or in addition to the typical momentary-On switches associated with finger depressible buttons on the remote controller. In novel combination with the analog sensors is circuitry for reading at least three readable states, analog values or conductance levels of each of the analog sensors, the states dependant upon depressive pressure applied to a finger depressible button associated with each analog sensor. The circuitry is structured to read an immediate, instant or current state or value of the analog sensors and to emit, via an emitter such as an antenna or infrared light or the like, function-control signals outward to the host device. The function-control signals can be of varied value or varied rate. The emitted signal is representative of varying electrical conductance related to the depressive pressure on the pressure sensitive analog sensors. In one embodiment of the invention, the amount of time the button associated with the analog sensor (s) is depressed is a factor determining the type of function-control signal emitted.

With the analog sensors applied as tuner channel-up and tuner channel-down sensors with depressible buttons associated therewith, and operable with a tuner channel changer such as on televisions, satellite receiver/tuners for televisions, cable boxes or VCR channel tuners or the like, the user is provided variable channel change rate control dependant upon the degree of depressive pressure applied to the button associated with the analog sensor of the remote controller. Low depressive pressure on the channel-up button provides a low or slow rate of channel changing upward through the channels, and relatively high depressive pressure on the channel-up button provides a high rate of channel changing upward through the channels. Likewise, low depressive pressure on the channel-down button provides a slow rate of scrolling downward through the channels, and relatively high depressive pressure on the channel-down button-provides a high rate of scrolling downward through the channels. Preferably, many different user determinable channel change rates are provided between low and high pressure on the associated channel change button so that the user is provided, for example, very slow, slow, medium, fast and very fast scroll rates. In a digital byte-stream, using 8 bits as a function-control signal representing a variable scroll rate analog sensor as herein taught, 256 different scroll rates can be provided the user through a single depressible button. Such an arrangement provides the user vastly improved channel scrolling control by allowing the user to apply low pressure to slowly move from one channel to the next, or to apply high pressure to move very rapidly through the channels, such as moving through 50 or 100 channels for example to get near a target channel, and then to reduce the applied pressure to the button to reduce the rate of scrolling in order to stop easily and precisely on the desired target channel.

When the analog sensors are applied as recorded video speed control sensors with depressible buttons associated therewith, such as being functional with VCRs, DVDs and the like, the user is provided variable video speed control dependant upon the degree of depressive pressure applied to an analog depressive button of the remote controller. Low depressive pressure on the speed control button provides a slow rate of scrolling through or playing the video, and relatively high depressive pressure on the speed control button provides a higher rate of scrolling through or playing the video. Preferably many video scroll rates or speeds are provided between low and high pressure applied to the associated button so that the user is provided for example very slow, slow, medium, fast and very fast video scroll rates. The video speed control can be applied to accelerate any of or all of the following modes commonly associated with recorded video players: the slow motion play mode, the standard play mode, the reverse or slow motion reverse modes, and forward and reverse scene search modes or the like. Such an arrangement provides the user vastly improved video viewing control by allowing the user to apply various degrees of pressure to one or more analog depressible buttons to vary the video speed.

A remote controller in accordance with the invention can be used with analog sensors also serving a dual role, one role as an On/Off switch and another role as a variable or analog sensor. For example, a recorded video device may be controlled with the dual role sensors in the following manner: pressing and immediately releasing a play button can be interpreted as activation of a simple momentary-On only On/Off switch, such activation indicating for example that normal play speed is desired. The same depressible button with the same sensor may be used in the second role by continuously holding down the play button beyond a given amount of time which can be interpreted as an analog input, for example, to play the video at a representative speed according to the depressive pressure. Likewise, fast forward buttons and reverse play buttons can operate in a respectively similar dual mode or dual role manner.

When the analog sensors are applied in a remote controller in accordance with the present invention for audio playback devices, the current invention offers advantages in manipulating the audio play stream. For example, the forward play button quickly pressed and released may start normal speed audio play, pressed again quickly and released, the host device recognizes the user wishes to go to the next audio selection or song, the button pressed and held continuously beyond a given amount of time instructs the host device to fast forward the audio stream at a rate representative of the depressive pressure. Conversely, the back button may operate the same in the opposite direction. Additionally, a remote controller in accordance with the present invention offers advantage to multiple disk players having a large number of selectable CDs or DVDs or the like, wherein user determinable selection rate of disks with a single button is of significant advantage.

When the analog sensors are applied in a remote controller in accordance with the present invention for controlling Internet integrated, or like on-line computer network host devices, the current invention offers great advantage in variably controlling screen scrolling, and/or video streaming speeds, and variably and/or incrementally controlling selection of hyper-links (links) and the like.

The present invention can assume different modes of operation including modes, which may be, but are not required to be backwardly compatible with many already existing parent or host devices so as to provide users improved control. The present improved remote controller can be built as a universal remote controller capable of functioning with many existing and future host devices which are set-up to be remotely controlled.

Additionally disclosed is an improved method of controlling a host device using a hand-held remote controller, and also methods of manufacturing an improved hand-held remote controller in accordance with the present invention.

While the present improved remote controller can be structured in numerous embodiments, one or more embodiments can be achieved with few and inexpensive changes in prior art technology in order to achieve the many benefits of the present invention. For example, the prior art dome-cap sensors as described above and commonly used on remote controllers have been always used as simple momentary-On only On/Off switches or bounceless On/Off switches in associated circuitry structured to use the sensor only as such a switch. I have discovered that the active element (conductive pill or element) of such prior art dome-cap sensors is compression or pressure-sensitive and variably conductive to a useful degree, and is thus pressure-sensitive variable-conductance material. This property of the active element can be used as an analog or variable pressure sensor. With applied varying pressure changes, the active element changes it's conductivity, i.e., resistivity, relative to the applied pressure or degree of compression of the active element. The active element, while a moderate to poor conductor when not under compressive force, drops in resistivity when placed under compressive force, such drop in resistivity being related to the amount of compression of the active element. This pressure-sensitive variable-conductance aspect of the active element in the elastomeric injection molded one-piece dome-cap opens many new and valuable possibilities of use, such as in remote controllers.

Such new possibilities include very low cost pressure-sensitive variable-conductance sensors allowing integration into a multitude of price sensitive consumer electronic items such as remote controllers. In the past, variable-conductance sensors incorporated into consumer electronic devices were expensive potentiometers and sliding plate resistors, or pressure-sensitive sensors which have typically been even more expensive, running from a few dollars and upward per sensor, and thus such pressure-sensitive sensors are sparingly used. Pressure sensitive variable-conductance sensors are not known to have been used as analog depressible buttons or sensors on remote controllers. On the other hand, the very low-cost elastomeric dome-cap sensors are currently manufactured in very high volume and ubiquitously used as simple only On/Off switches in the large body of currently existing remote controllers.

The elastomeric injection molded dome-cap provides an extremely low cost member capable of serving multiple functions, all of which can be advantageous and beneficial for a pressure-sensitive variable-conductance sensor in a remote controller as taught herein. Such multiple functions of the elastomeric one-piece injection molded dome-cap can include: the dome-cap serving as an inexpensive return spring for ensuring termination of pressure on the active element; the top exterior of the dome-cap providing a finger engagement surface when properly fashioned for serving as a finger placement surface on which a user can press absent a requirement of additional button caps or triggers atop the dome-cap; a seal or debris excluder over electric component surfaces such as the active element and adjacent circuit elements which could be adversely affected by the entrance of foreign matter; tactile feedback to the user upon actuation and de-actuation of the active element or sensor; an ergonomically correct depressible surface which is variably depressible through a wide range, generally absent an uncomfortable hard-stop at the bottom of the depressive stroke; and the injection molded dome-cap providing these functions can be mounted on various base materials such as flexible membrane circuit sheets, rigid circuit boards and flexible membranes supported or stiffened by rigid boards which can themselves possess circuitry.

Additionally, the injection molded dome-cap can be manufactured with multiple dome-caps in a single injection molded sheet wherein all of the dome-caps can be utilized as novel pressure sensors or some of the dome-caps can be novel pressure sensors mixed with other dome-caps used as traditional momentary-On only On/Off switches. Such multiple dome-cap sheets can be highly useful in remote control devices for controlling television, video playback and the like devices wherein many functions may be best served with momentary-On switches (e.g. power On/Off toggling) while other functions (e.g. channel selecting and/or video speed buttons) can be best served with variable-conductance pressure sensors, using the teachings herein.

Another benefit taught herein is the ease of changeover by manufactures who currently make remote controller devices including housings with circuit boards therein, elastomeric dome-cap sensors associated with the circuit boards, openings through the housings to allow access to the dome-caps to allow depression thereof, and in some cases button covers over the injection molded dome-caps. Following the herein teachings, in the most minimal case, such manufacturers will only need to apply new or modified circuitry on the circuit boards capable of reading any one of at least three readable states (electric states or values) or many more representing depression of the dome-cap sensor. The at least three states of the dome-cap and active element can represent at least: 1) no pressure, 2) low pressure, and 3) high pressure applied to the dome-cap and thus the active element. The dome-cap analog sensor and circuitry arrangement as herein taught can be employed in a manner wherein not just three but many states are read, thus ensuring high resolution reading of a variably changing depressive button pressure input.

Yet another benefit of the teachings herein is that not only can a typical prior art dome-cap style switch be used as a pressure-sensitive variable-conductance sensor in a remote controller, but if desired, such a sensor can also supply the user with a tactile feedback on actuation of the sensor, and even further upon de-activation of the sensor. Benefits of the tactile feedback include a reduction of potential confusion on the part of the user as to when the sensor is actuated and de-actuated. For example, if an analog sensor or sensor used as an analog sensor of the type not having tactile feedback is minimally activated, it is difficult for the user in many instances to determine whether the sensor is still minimally activated or is entirely de-activated.

These, and many other advantages and benefits of the present invention will become increasingly appreciated with continued reading and with a review of the drawings.

BRIEF DESCRIPTION OF THE DRAWINGS

FIGS. 3–5 show the remote controller of FIG. 2 partially disassembled or not yet fully assembled such as during manufacturing wherein FIG. 3 is a view into the back half of the housing front of the controller and showing the back surface of a sheet of elastomeric dome-caps installed therein; FIG. 4 shows the circuit board of the controller and FIG. 5 shows the inside of the back half of the two piece or split housing.

BEST MODES FOR CARRYING OUT THE INVENTION

In elaboration of the hereinabove details of the Invention and with reference to the included drawings, best modes for carrying out the invention will now be further described.

Figure 1:
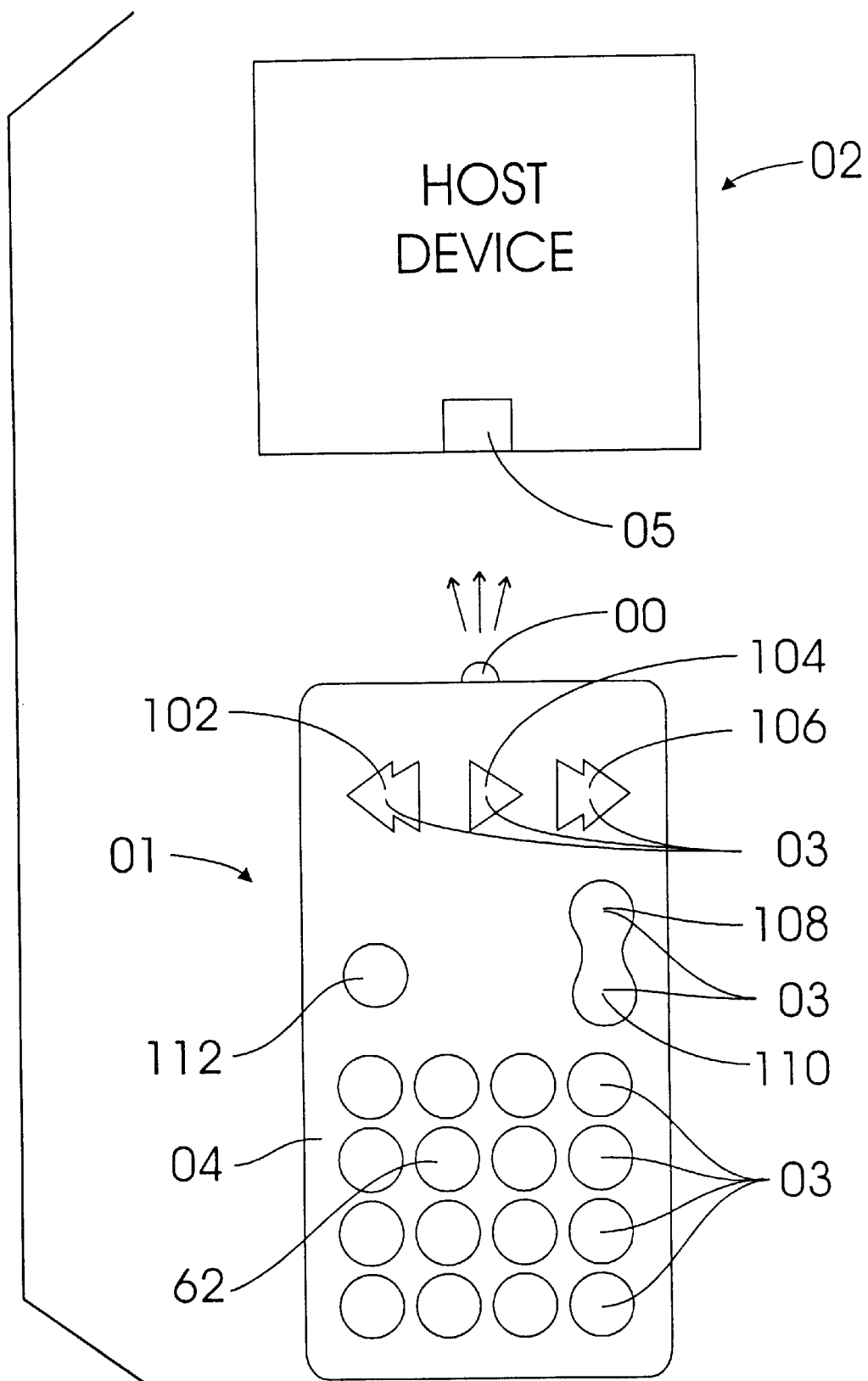
FIG. 1 is an illustration of a hand-holdable remote controller and a host device.

FIG. 1 is an illustration of a hand-holdable remote controller 01 and a host device 02. Remote controller 01 physically appears as many prior art remote controllers and can be the appearance of a remote controller in accordance with the present invention, although the improved remote controller as taught herein can be shaped into many different appearances. Remote controller 01 will henceforth be treated as a remote controller structured in accordance with the present invention. Remote controller 01 is shown with a plurality of finger depressible buttons 03 exposed on the front of the case or housing 04. The housing 04 contains circuitry (not shown) such as on a circuit board for interfacing with sensors associated with the depressible buttons 03. Some of the buttons 03 are associated with momentary-On only On/Off switches which the circuitry reads only as such, i.e., On or Off, having only two readable states, while others of the buttons 03 are associated with pressure-sensitive variable-conductance sensors (analog sensors) which the circuitry reads as having at least three readable states, e.g., Off, first On state and second On state. Preferably, there is a continuum of many variable On states.

The remote controller 01 is shown for example including custom shaped variable buttons 03 such as video speed control buttons 03 including a reverse button 102, a forward button 104, and a fast forward button 106 which may be utilized as variable or dual role as herein detailed. Such variable and dual role functionality may also be applied to dual ganged button 03 having an upper component serving as a tuner channel-up selecting type button 108, and a lower component serving as a tuner channel-down selecting type button 110. Also shown is a On/Off power button 112 illustrating that some of the button functions are best served by an only On/Off switch which is read by the circuitry has having only two states. Also shown is a numeric button keypad 62.

Host device 02 is intended to be illustrative of a variety of host devices which include electronics allowing for remote control and which can be remotely controlled with remote controller 01 or 06 (FIG. 2) in accordance with the present invention. Such host devices include televisions, satellite receiver/tuners, video playback devices such as VCRs, DVDs and the like, audio playback devices and the like, and personal computers or the like devices for accessing and maneuvering through on-line computer networks. A signal receiver 05 is indicated on the front of the host device 02 in FIG. 1, the receiver 05 as those skilled in the art understand, typically being a window, or the like, in which an electronic receiver system is mounted to receive function-control signals emitted from a remote controller such as 01 or 06.

Figure 2:
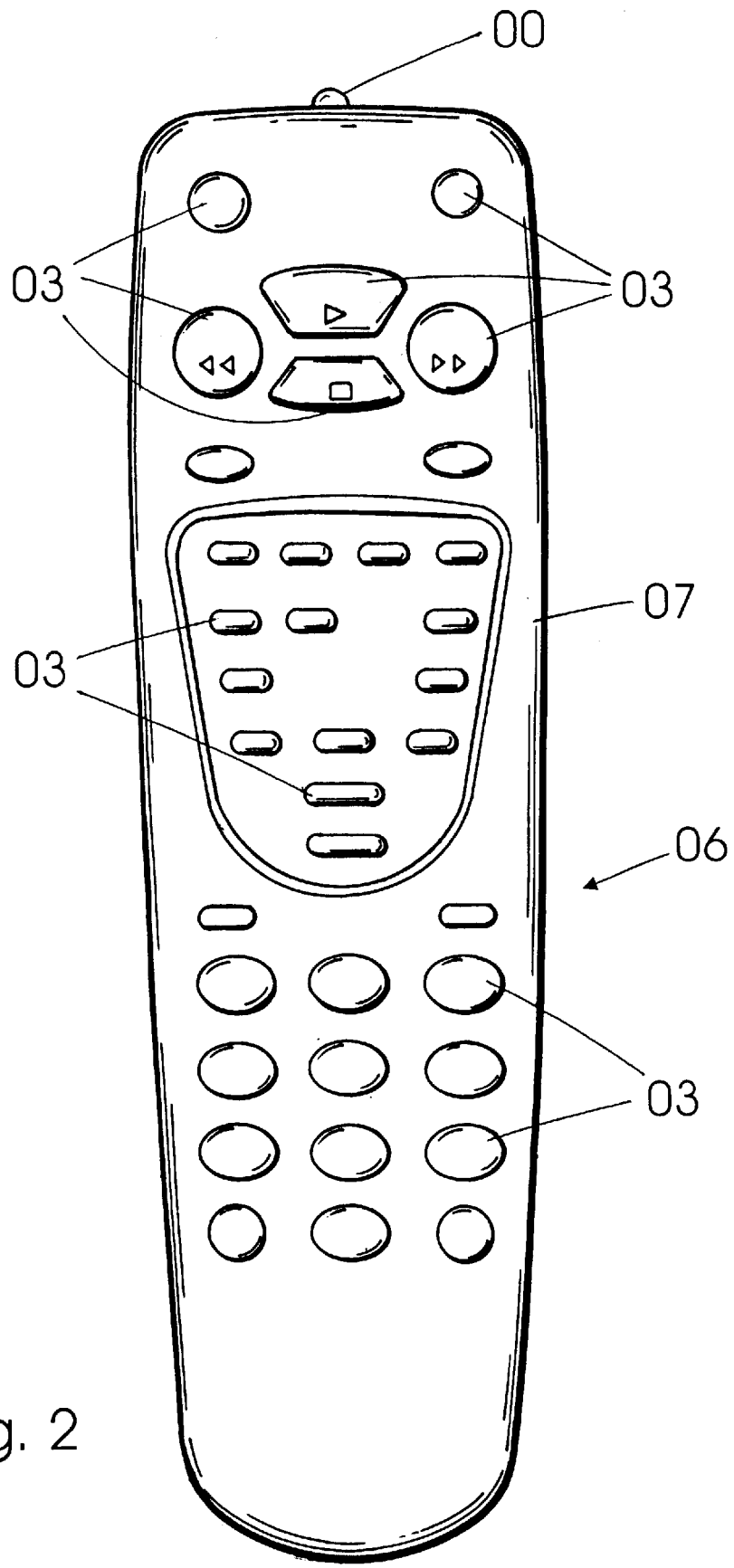
FIG. 2 is a front view of another hand-holdable remote controller having a plurality of depressible buttons.

FIG. 2 is a front view of hand-holdable remote controller 06 having a plurality of finger depressible buttons 03 exposed on the front of the case or housing 07. Remote controller 06 physically appears as many prior art remote controllers and can be the appearance of a remote controller in accordance with the present invention, although the improved remote controller as taught herein can be shaped to appear substantially different. Remote controller 06 will henceforth be described as a remote controller structured in-accordance with the present invention. Remote controller 06, like that of controller 01, contains circuitry inside housing 07 such as on a circuit board 09 (see FIG. 4) for interfacing with sensors associated with the depressible buttons 03. Some of the buttons 03 are associated with momentary-On only On/Off switches which the circuitry reads only as such, i.e., On Off, or as having only two readable states, while others of the buttons 03 are associated with pressure-sensitive variable-conductance sensors (analog sensors) such as in FIGS. 7, 9, 11, 12 or 13–15 (to be described below) which the circuitry reads as having at least three readable states, e.g., Off, a first On state and a second On state which can be On low and On high. Other assignments can be made for the three readable states, as well as many On states between On low and On high which the human user can control through varied or different amounts of depressive pressure applied to the button associated with such analog sensors. Normally only one depressible button is or will be associated with only one analog sensor.

Figure 3:
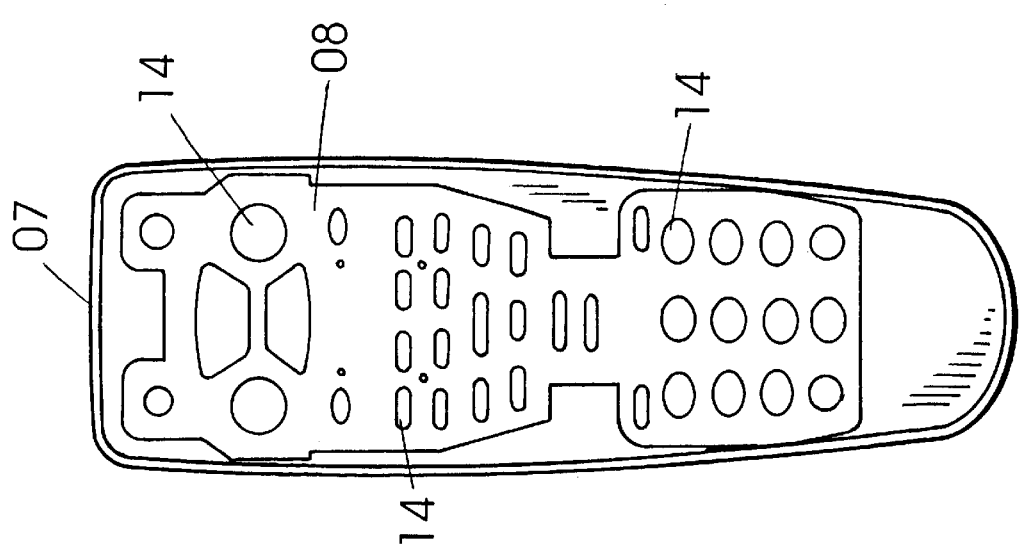
Figure 4:
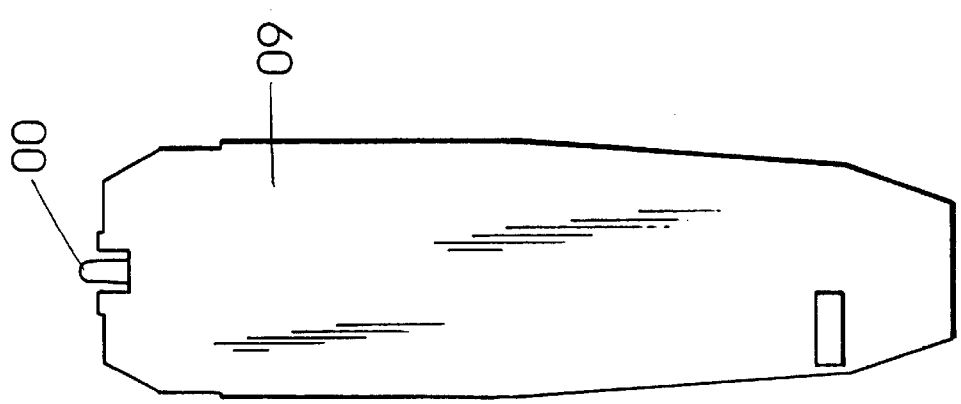
Figure 5:
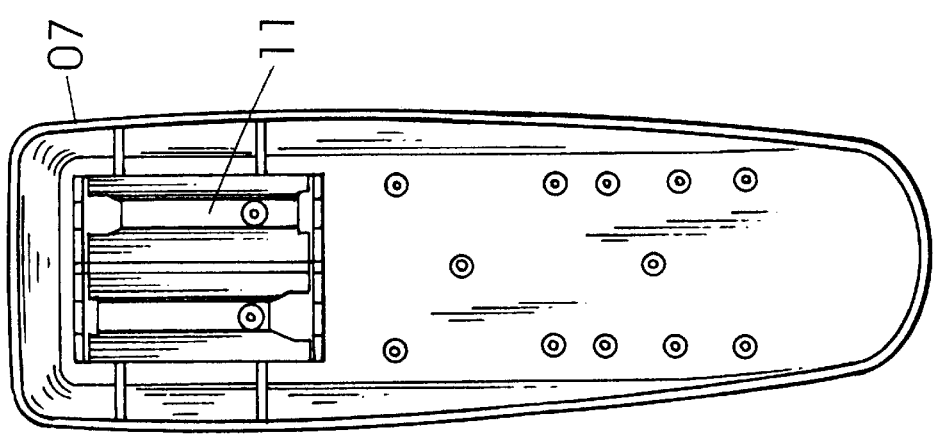
Figure 15:
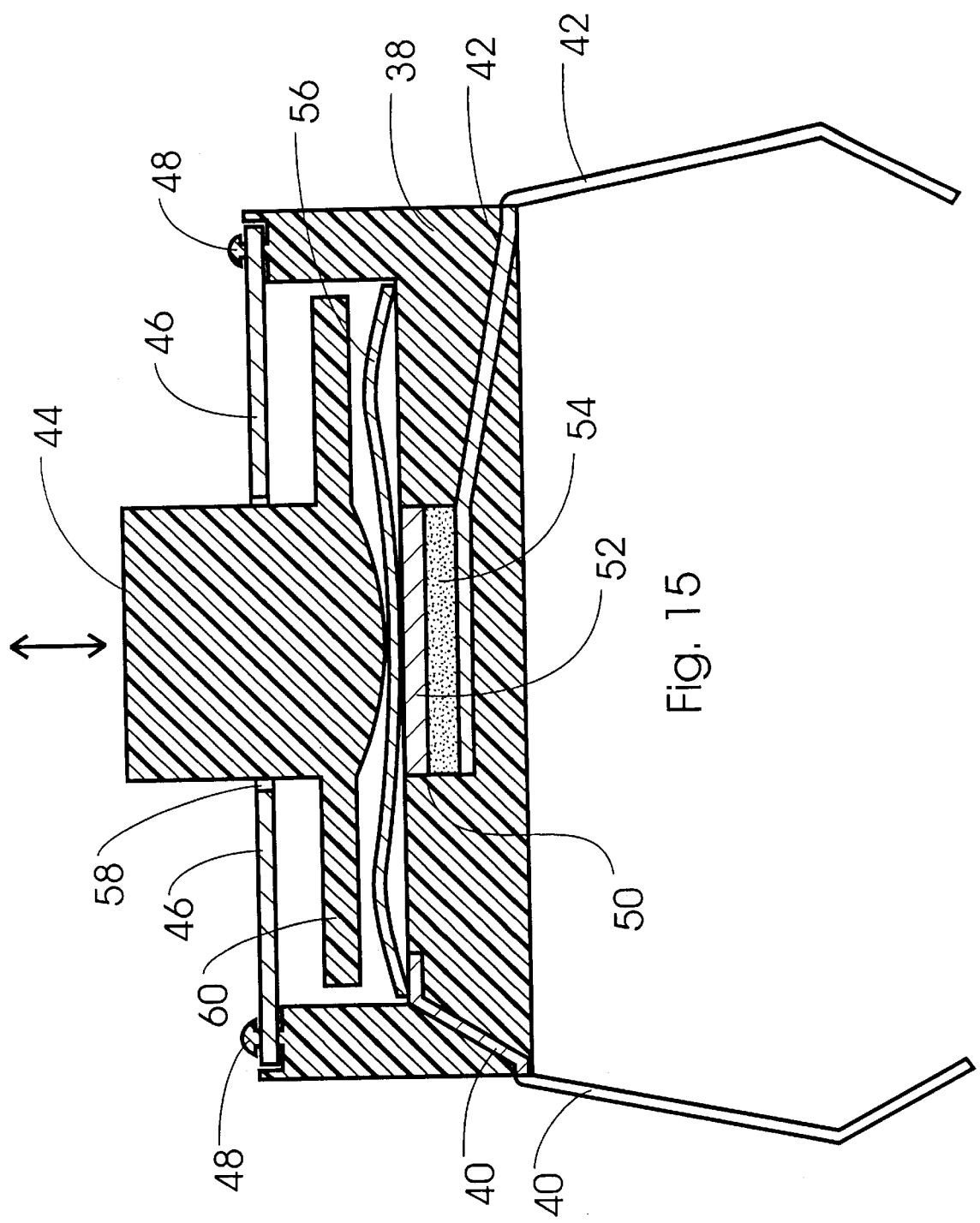
FIG. 15 shows a median cross section view of the sensor embodiment of FIGS. 13–14 in a depressed or actuated condition.
Figure 16:
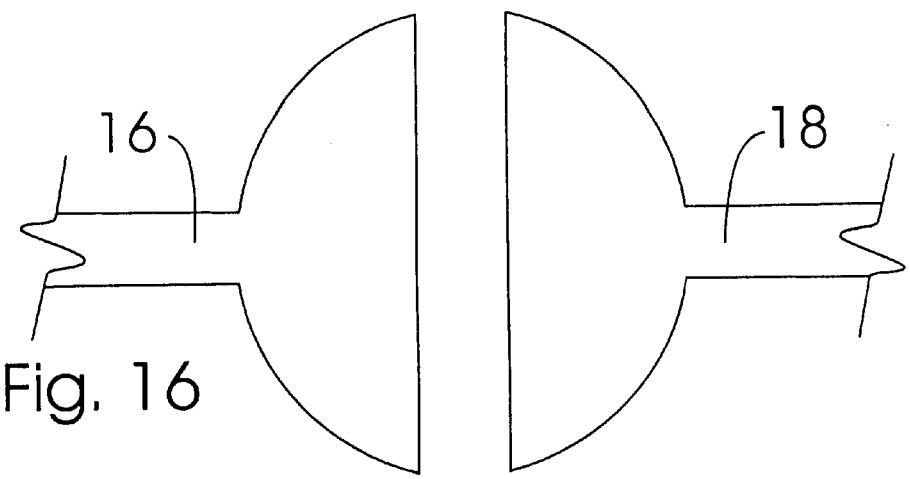
FIGS. 16–18 each show a top view of varied proximal conductive elements useful generally for interfacing between the active element of an elastomeric dome-cap sensor and a circuit board or circuit bearing membrane sheet or the like circuit bearing sheet.
Figure 17:
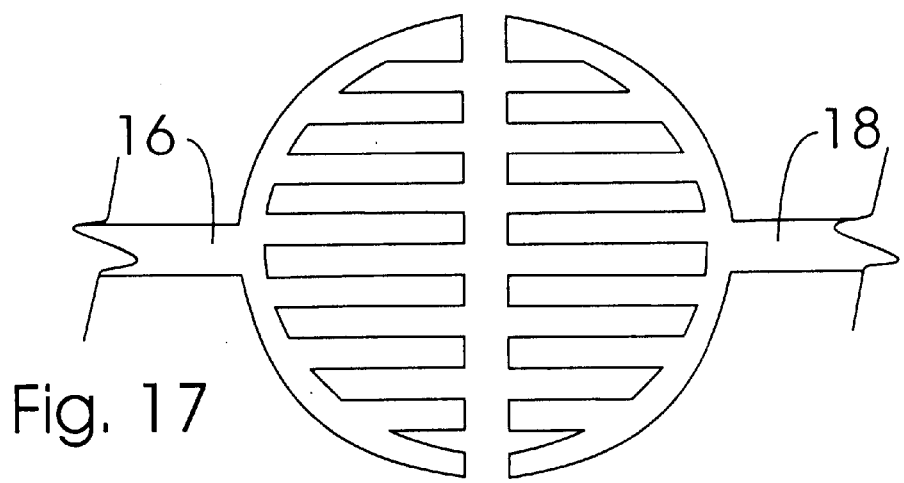
Figure 18:
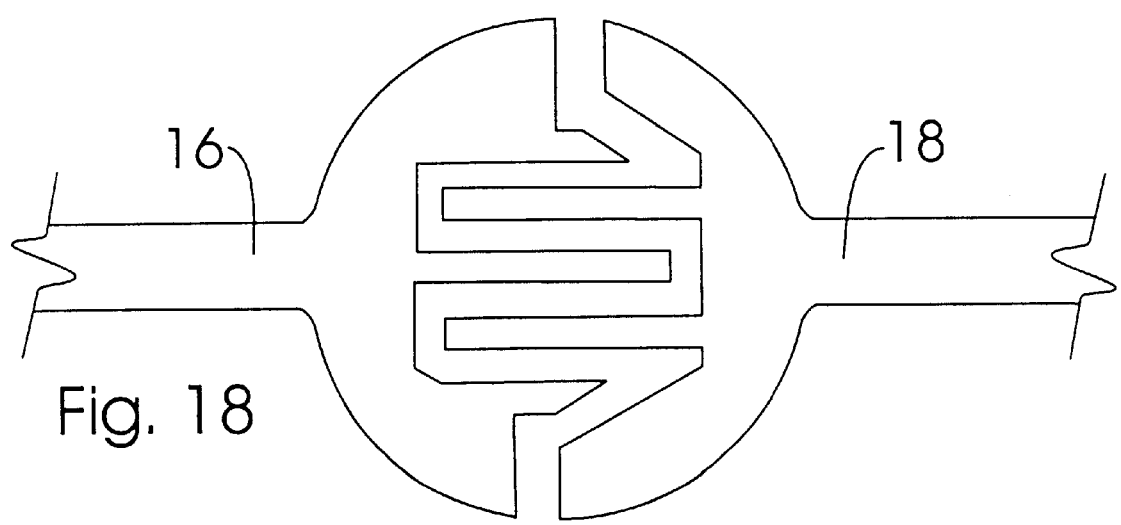

FIGS. 3–5 show remote controller 06 of FIG. 2 partially disassembled or not yet fully assembled such as during manufacturing thereof, wherein FIG. 3 is a view into the inside back half of the front of housing 07 and showing the back surface of a sheet of elastomeric dome-caps 08 installed therein; FIG. 4 shows the circuit board 09 of remote controller 06 and FIG. 5 shows the inside of the back half of the split or two piece housing 07. FIG. 5 also shows a battery socket 11 allowing batteries to be inserted into housing 07 to serve as an electrical power source connecting to circuit board 09 to provide electrical power for operation of remote controller 06, i.e., powering the circuitry and emitter 00 of the circuitry of circuit board 09. Circuit board 09 in FIG. 4 is shown including the emitter 00 connected thereto and which is or would be connected to the circuitry of the board allowing the circuitry of the board 09 to control or drive emitter 00. Emitter 00 can be an antenna or infrared light or the like radiation or signal emitter capable of sending or emitting signals such as function-control signals outward from housing 07 (outward from the remote controller). Circuitry is not shown on circuit board 09 in FIG. 4 due to the small size of the drawing figure, but would appear as circuit traces connecting to the battery, extending to an ASIC microcontroller, CPU or discrete components and/or the like, extending to emitter 00, and including, if elastomeric dome-caps sensors are used, proximal conductive circuit elements such as shown in FIGS. 16–18 located under each dome-cap for interfacing with the active element 14 (FIG. 7) of the dome-caps. If dome-cap type sensors are not used, but instead packaged switches or analog sensors are used, such as the analog sensor of FIGS. 13–15 to be described below, the circuitry of board 09 would be structured to connect conductive connecting legs 40 and 42 as will be detailed below.

Figure 6:
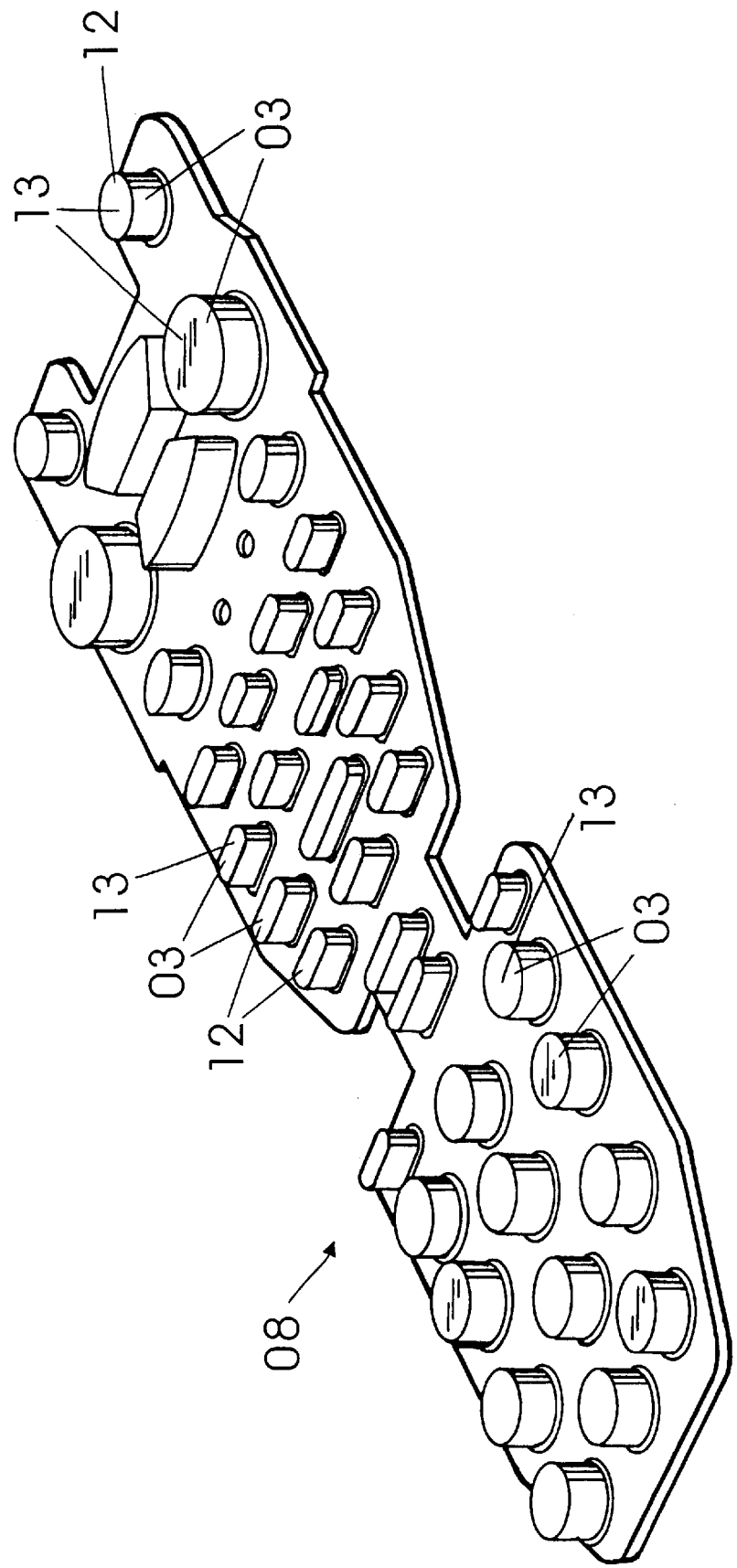
FIG. 6 shows the sheet of elastomeric dome-caps of FIG. 3 removed from the housing and flipped over to show the front side with depressible buttons.

FIG. 6 shows the sheet of elastomeric dome-caps 08 of FIG. 3 removed from the housing or not yet installed therein, and flipped over to show the front side with depressible buttons 03 of the individual dome-caps 12. The depressible buttons 03 in this example are integrally molded continuations or enlarged extensions of the dome-caps 12. The outer most surfaces 13 of the individual dome-caps 12 or more precisely the buttons 03 thereof serve as surfaces against which a finger can be placed to depress the dome-cap and actuate the associated electrical circuitry. As those skilled in the art understand, dome-caps 12 can include plastic button caps or covers which define the exposed portions of the dome-caps against which a finger can be applied to depress. Additionally sheet connected dome-caps as shown in FIG. 6 are commonly molded as single integral units making it both quick and inexpensive to manufacture a plurality of dome-caps 12 in desired patterns or positions relative to one another, and further, sheet connected dome-caps 12 can be quickly installed as a unit in a housing having openings through which the surfaces 13 of the dome-caps 12 protrude. It should be noted that dome-caps 12 or dome-cap sensors can be made in single unit form and not connected to other dome-caps by connecting sheeting.

Figure 7:
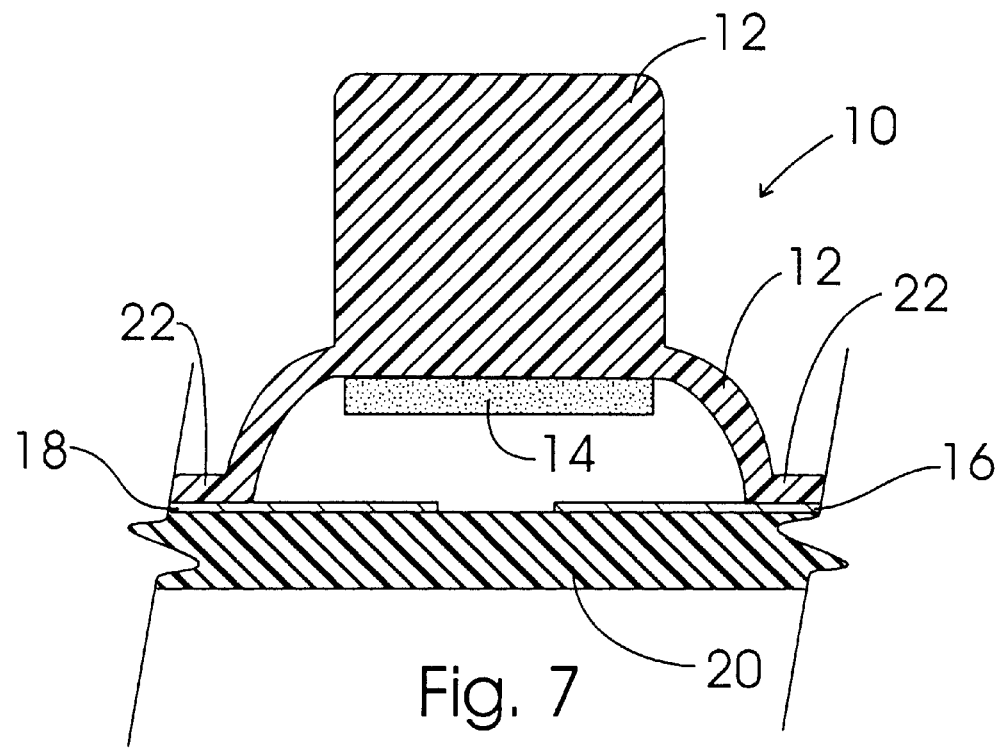
FIG. 7 shows a median cross section view of an elastomeric injection molded one-piece dome-cap sensor. The sensor is shown with the active element attached to the underside or bottom of the raised dome-cap and thus the active element is carried by and within the dome-cap.

FIG. 7 shows a median cross section view of an elastomeric dome-cap sensor 10, which is an electrical sensor using a dome-cap 12 as a component thereof. Dome-cap sensor 10 is in accordance with the prior art and can be used in a novel new use of such a sensor in a remote controller in accordance with the present invention, and in a novel new structural combination as herein disclosed in accordance with the present invention. Sensor 10 is shown in the deactivated state or condition with the elastomeric one-piece injection molded dome-cap 12 raised and thus the active element 14, i.e., conductive pill is shown raised and disengaged from two proximal conductive elements 16, 18. The sensor 10 is in a "state" which is readable by circuitry and which could or can be considered an Off state or first state. In a remote controller in accordance with the present invention, the two proximal conductive elements 16 and 18 are or would be conductive elements of the circuitry on circuit board 09 or the like circuit bearing member. The active element 14 is attached to the underside of dome-cap 12 and is thus carried by the dome-cap, the attaching most commonly being by the dome-cap 12 being formed by injection molding to the pre-formed active element 14 which has been inserted into the molding cavity prior to the injecting of the thermoset rubber commonly used to make highly durable dome-caps 12. Multiple shot injection or adhesive attachment or any other suitable connection can be used to connect active element 14 to injection molded dome-cap 12. Conductive elements 16, 18 are shown attached to or supported by a typically non-conductive base 20 which is a board of a circuit board such as circuit board 09, a flexible membrane sheet, combination thereof or the like. Dome-cap 12 is shown with an outward extending flange 22 at it's bottom end on base 20 extending parallel to base 20. Flange 22 is typically integrally injection molded or in one-piece with the balance of dome-cap 12. Flange 22 can be adhered in place to base 20 such as with adhesives or dome-cap 12 can be otherwise held in proper location to base 20 and conductive elements 16, 18 such as with mechanical restraints, as for example by sandwiching flange 22 between portions of a housing or the like, or by having the upper portion of dome-cap 12 positioned within a movement restricting opening in a housing which only allows the upper portion to move toward and away from base 20 and conductive elements 16, 18. Flange 22 can be a portion of the sheet connecting multiple dome-caps 12. The FIG. 7 sensor with the active element containing tungsten carbide is a highly preferred sensor embodiment for use with or in conjunction with the present invention.

Figure 8:
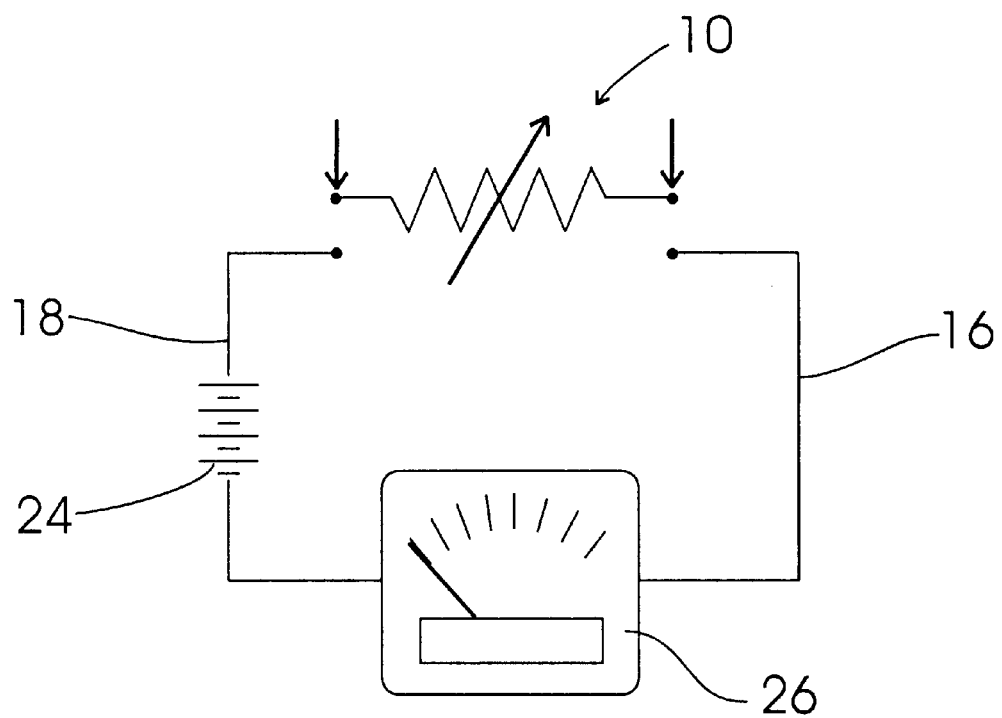
FIG. 8 shows a simple electrical circuit arranged to be an analog sensing circuit and utilizing the elastomeric dome-cap sensor of FIG. 7 as a pressure-sensitive variable-conductance sensor.

FIG. 8 shows a simple electrical circuit structured to be an analog sensing circuit and utilizing the elastomeric dome-cap sensor 10 of FIG. 7 as a pressure-sensitive variable-conductance sensor. "Analog sensing circuit" is one which is structured to be at least in part manipulated or controlled by operation of an analog sensor, the analog sensor being a sensor capable of being read by analog sensing circuitry as having at least three readable states dependant upon applied depressive pressure. No applied depressive pressure can be and will normally be treated as an amount of depressive pressure and associated with one of the three readable states. Also specifically shown is a battery 24 as an example of an electrical power source in the circuit, and a meter 26 including an electromagnetic coil engaged to a moveable indicating needle adjacent a printed scale or range gauge and capable of showing varying conductivity across the elastomeric dome-cap sensor 10. The dome-cap sensor 10 is indicated in the circuit as being in what could be considered a first or open state in this example. It should be understood that depressive pressure applied to the dome-cap 12 will move the raised portion of the dome-cap 12 toward base 20 sufficiently to bring the active element 14 into contact with both conductive elements 16, 18, and with sufficient pressure, and varying pressure well within a range readily applied by a human finger, the sensor 10 will be moved to second and third, etc. states with increasing applied pressure, and the different states in this example, because this is an analog circuit, will be indicated by the needle of the meter 26 being positioned left, right or at various states in between on the scale. The scale of meter 26 in this example includes marks which the needle moves through, in this example the needle moving to the right as the resistivity of the active element 14 decreases. It can be appreciated that while the marks are only printed on the scale, each mark represents a position the needle can pass through, and an electrical state of the sensor in which each can have a digital bit assignment associated therewith. In this example, higher pressure to dome-cap 12 and active element 14 would move the needle further to the right indicating lower resistivity, i.e. greater conductivity of active element 14. As those skilled in the art can appreciate and as will be further discussed below, digital bit assignments can be made for any level or state of conductivity and at least two bits of digital information are required for identifying more than two readable states. Such digital information can readily be used as function-control signals emitted from the remote control to control functions of a host device 02. It should be understood that meter 26 is only for illustrative purposes, as such a meter with needle is not anticipated as being required in a remote controller in accordance with the invention.

Figure 9:
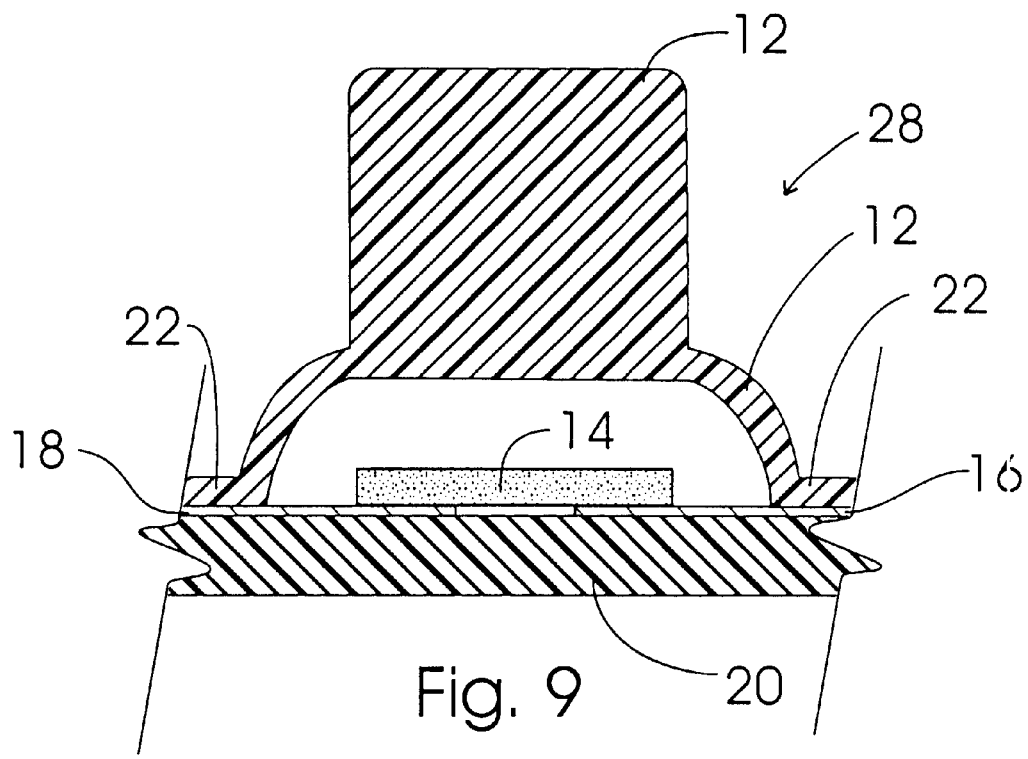
FIG. 9 shows a median cross section view of another embodiment of elastomeric injection molded one-piece dome-cap sensor. The shown sensor is a structural arrangement wherein the active element is shown atop and spanning across two proximal conductive elements and within the injection molded dome-cap but not carried by the dome-cap. The elastomeric injection molded dome-cap is shown in a raised position above the active element.

FIG. 9 shows a median cross section view of an elastomeric dome-cap sensor 28 structured with the active element 14 mounted atop and spanning across the two proximal conductive elements 16, 18. The dome-cap 12 is shown in a raised position above the active element 14 and the sensor is shown in what can be used as or considered as a deactivated state or first state (off or open state) since no compressive pressure or force is being applied to active element 14. The conductive pill or active element 14 of a typical prior art dome-cap sensor is a moderate to poor conductor when not compressed and becomes a much improved conductor under compression, and this means that if active element 14 of the FIG. 9 sensor is made of the same material commonly used as the active element in prior art dome-cap sensors, then when the dome-cap is raised as shown in FIG. 9, minimal current (little if any current depending upon the applied voltage) can flow between the two proximal conductive elements 16, 18. Such minimal current flow is to a lessor extent than if the active element were under compression, and so this lessor extent, if desired, can be treated as and assigned a bit assignment representing a deactivated state with the activated states being associated with the varying conductivity of the active element 14 when under varying degrees of compression. Active element 14 is shown in FIG. 9 within the dome-cap but not carried by the dome-cap 12.

Figure 10:
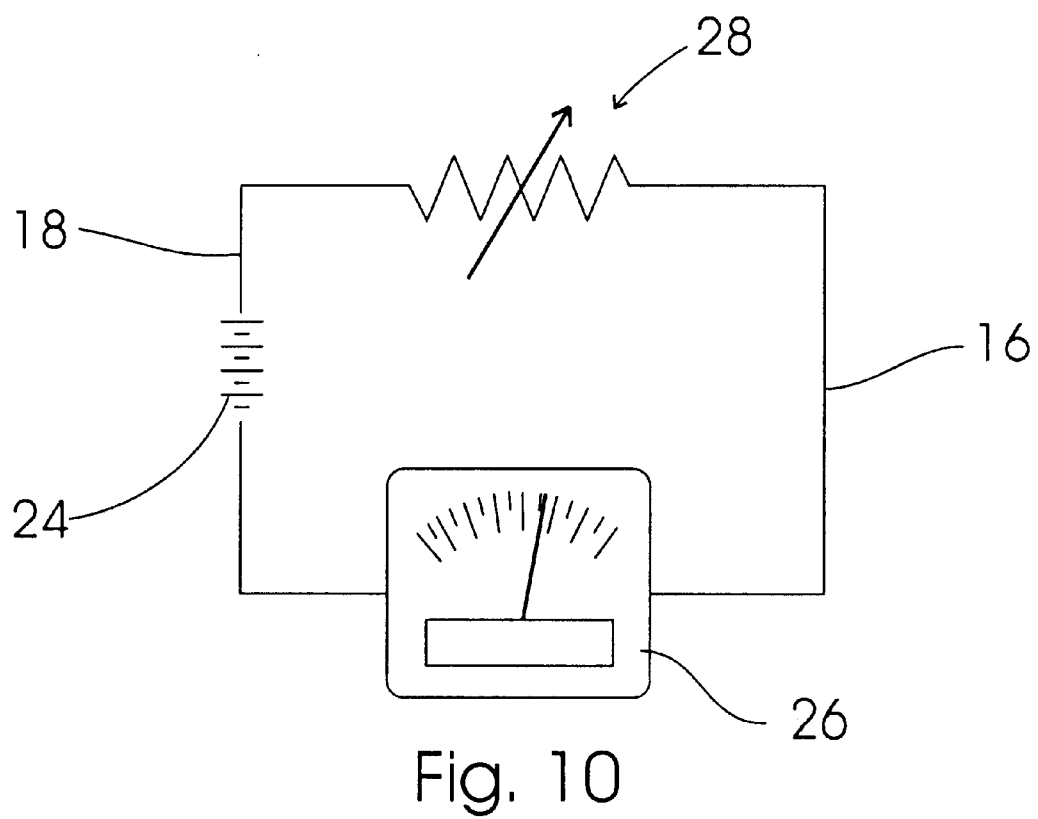
FIG. 10 shows a simple electrical circuit arranged to be an analog sensing circuit and utilizing the elastomeric dome-cap sensor of FIG. 9 as a variable-conductance sensor.
Figure 11:
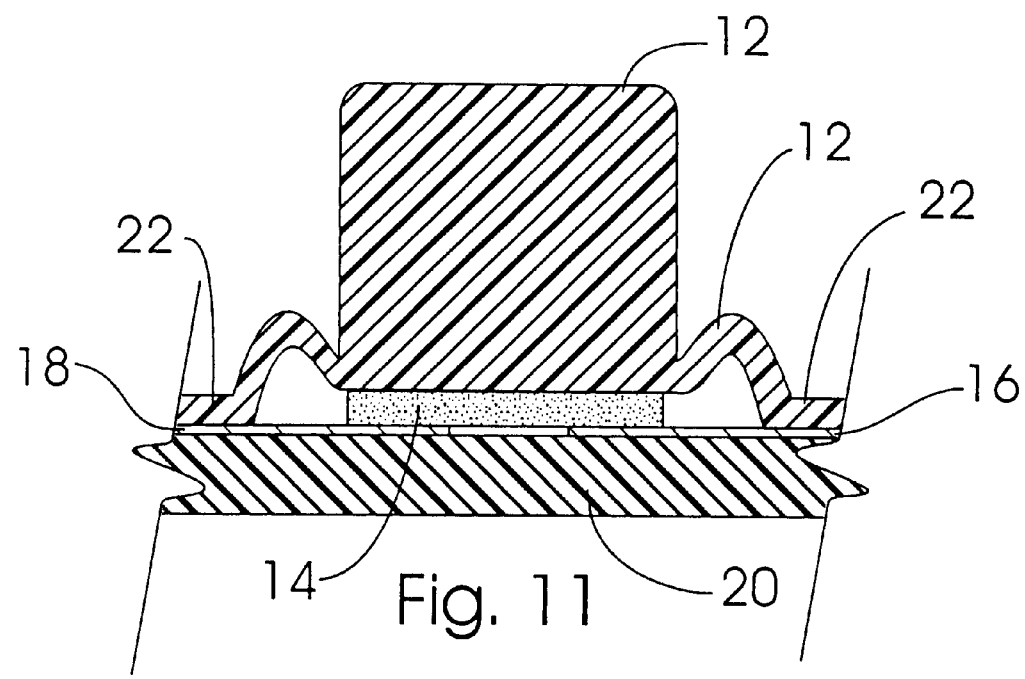
FIG. 11 shows a median cross section view of an elastomeric dome-cap sensor with the dome-cap depressed and representing the dome-cap sensors of either FIG. 7 or FIG. 9 in a state wherein compression or force of some level or amount is applied to the active element.

FIG. 10 shows a simple electrical circuit arranged to be an analog sensing circuit and utilizing the elastomeric dome-cap sensor 28 of FIG. 9 as a pressure-sensitive variable-conductance sensor in combination with a meter 26. The needle of meter 26 is shown moved somewhat to the right to indicate compressive force being applied to active element 14 with dome-cap 12 depressed as shown in FIG. 11 wherein the sensor is in an activated state. Again, meter 26 is only for illustrative purposes, as such a meter with needle is not anticipated as being required in a remote controller in accordance with the invention.

FIG. 11 shows a median cross section view of an elastomeric dome-cap sensor with the sensor shown in the activated state or condition with the dome-cap 12 depressed and representing the dome-cap sensors of either FIG. 7 or FIG. 9 in the activated state, i.e., activated state meaning with the active element 14 under a degree of compression from the depressed dome-cap 12. Deactivated state generally meaning the active element 14 is not being compressed by the dome-cap 12.

Figure 12:
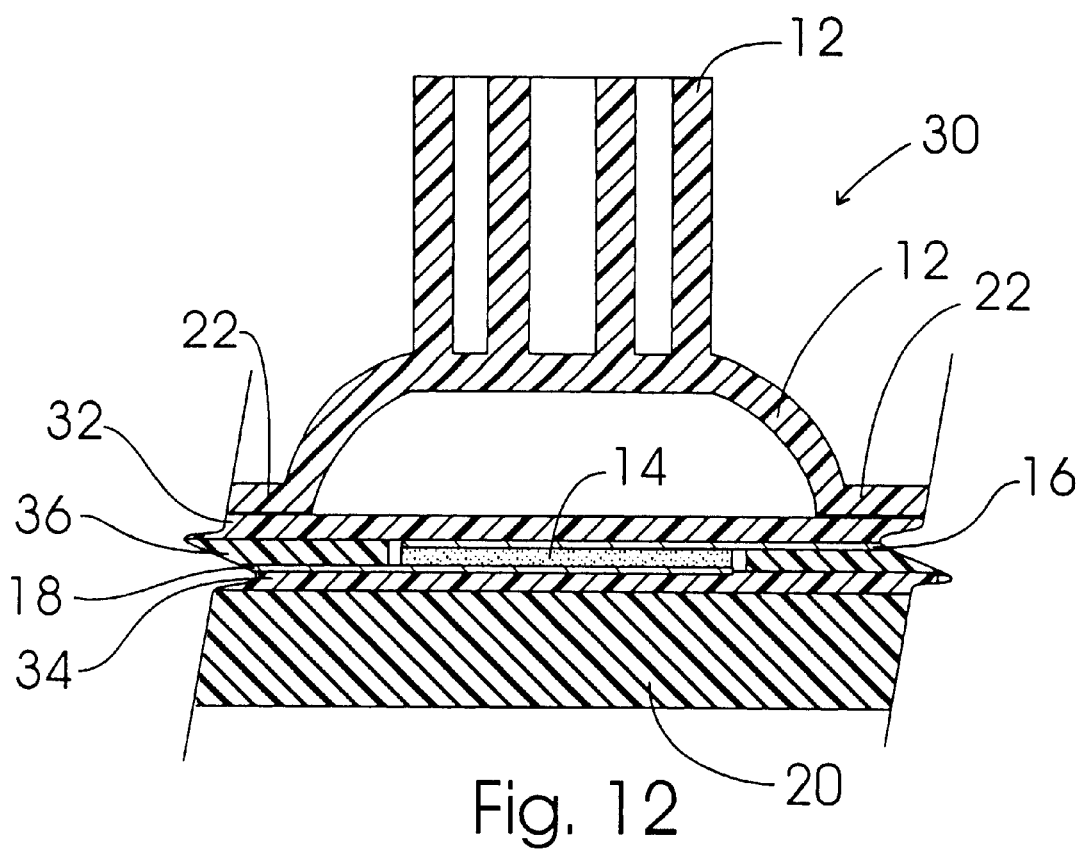
FIG. 12 shows a median cross section view of a sensor which uses an elastomeric injection molded one-piece dome-cap. The active element is shown sandwiched between two membrane sheets which are separated by a center membrane sheet having a hole which is filled with the active element. The active element is shown beneath the underside center of the raised one-piece injection molded elastomeric dome-cap and below or outside of the dome-cap. In this illustration, the active element is shown neither carried by the dome-cap nor within the dome-cap.

FIG. 12 shows a median cross section view of an elastomeric dome-cap sensor 30 in the deactivated state or condition with active element 14 sandwiched between two non-conductive flexible membrane sheets 32, 34 which are separated by a center membrane sheet 36 which includes a hole therein filled with active element 14. The membrane sheets are shown atop a stiff base 20 beneath the underside center of the raised dome-cap 12 which is mounted atop the upper most membrane sheet. Two proximal conductive elements 16, 18 are shown between the membrane sheets 32, 34 and contacting opposite sides of active element 14. The proximal conductive elements 16, 18 can be printed conductive ink on membranes 32 and 34. Active element 14 which is not carried by dome-cap 12 is shown beneath the underside center of the raised dome-cap 12 and outside of, or not within dome-cap 12, but rather is below the bottom surface of flange 22. The dome-cap 12 can be manually depressed to move toward base 20 to apply pressure on the nearest membrane sheet 32 which will flex and transfer depressive force into active element 14 which will alter it's conductivity relative to the degree of compression or force thereon, thus altering the conductivity through active element 14 between proximal conductive elements 16, 18.

FIG. 12 additionally shows that dome-cap 12 can be manufactured with uniform wall thickness such as to accommodate certain materials which mold and perform in an improved manner when kept uniform in thickness, as opposed to those embodiments shown in FIGS. 7, 9 and 11 which have an upper portion of much greater thickness than the lower portion of the dome-cap 12.

The embodiment of FIG. 12 shows active element 14 sandwiched between conductive elements 16 and 18 as taught in the Mitchell U.S. Pat. No. 3,806,471 and further sandwiched between membrane sheets as shown in the Eventoff U.S. Pat. No. 4,315,238 as a bounceless On/Off switch. My addition of the elastomeric injection molded one-piece dome-cap 12 in this embodiment creates a novel sensor with some, but not all, of the above discussed advantages afforded to an injection-molded dome-cap sensor having analog or pressure sensitive properties. While the novel embodiment of FIG. 12 is or would be functional with the present invention, it is not the most preferred sensor discussed herein for certain reasons such as: this embodiment is not the lowest cost manufacturing technology discussed herein, or the easiest to manufacture, or the best performing sensor embodiment described herein.

In order to gain the benefits of the present invention, manufacturers who currently make remote controller devices (including housings with circuit boards therein, elastomeric dome-cap sensors associated with the circuit boards, openings through the housings to allow finger access to the dome-caps or to otherwise allow depression thereof, and in some cases button covers over the dome-caps) need only, in the simplest case, apply new or modified circuitry (including any necessary circuitry programing) on the circuit boards capable of reading any one of at least three readable states (electric states or values) and preferably many more readable states representing depression of the dome-cap sensor. The at least three states of the dome-cap and active element (sensor) can represent at least: 1) no pressure, 2) low pressure, and 3) high pressure applied to the dome-cap and thus the active element and different level of conductivity thereof. The three states are defined, for example, by the different levels of conductance of the active element such as when under no pressure and essentially deactivated, and when under compressive pressure at a first level and when under compressive pressure at a second level. The new or modified circuitry needs to be capable of reading any one of the at least three readable states of the dome-cap sensor 10. Such readable states, for example, can be: 1) a first level of electrical resistance being relatively high resistance or open across the proximal conductive elements indicating the dome-cap as raised; 2) a second level of electrical resistance being less than the first level but allowing current flow between the proximal conductive elements and being indicative of the dome-cap being lightly depressed and lightly compressing the active element 14; and 3) a third level of electrical resistance being less than the first and second levels and allowing current flow between the proximal conductive elements 16, 18 and being indicative of the dome-cap being depressed and compressing (applying force) active element 14 more firmly or with greater pressure compared to the second level or state. Each state can be associated with an individual bit or digital assignment, although if the no pressure or first pressure level of the analog sensor is treated as an open switch not requesting any action, typically there would not be a need for a function-control signal to be emitted from the remote controller 01 or 06 to a host device 02 for this first state, but second and third states would be associated with a bit or digital assignment which resulted in a function-control signal being emitted by emitter 00 from the remote controller 01 or 06 to host 02.

Analog to digital conversion connotes transferring the variable or different electrical states of the active element in a manner requiring a minimum necessary or required number of digital bits to describe a maximum possible number of variable states. The conversion requiring at least two digital bits or equivalent wording thereto, means that the active element 14, being variably conductive, i.e., variably resistive or variably rectifying, can be described as having more than only two possible states of electrical conductivity, and those states can be described with digital information (bits). The number of bits necessary (required) to describe a specific possible number of states is well known by those skilled in the art, as the possible described states is a factor of the bits required to describe such states. For example: two different states require at least one digital bit to describe, On or OFF, the bit is a zero or a one; three different states require at least two digital bits to describe; and three bits are required to describe a minimum of 5 states; to describe a somewhat smoothly variable active element having 256 states requires at least eight bits of digital information, etc. The term "storing" means that a representative value of a read state of the active element 14 is at least stored in some register at some time within the digital electronics processing the status of the active element 14.

The conductive pill or active element 14 of typical prior art elastomeric dome-cap sensors is variably conductive and pressure-sensitive to a degree quite useful in an analog sensing circuit as herein disclosed. Such prior art active elements are believed to be primarily carbon within an elastomeric or rubbery binder. However, within the scope of the invention, variable conductance can be achieved with other materials having either variable resistive properties or variable rectifying properties. For the purpose of this disclosure and the claims, variable-conductance and equivalents thereto means either variably resistive or variably rectifying. Pressure-sensitive variable-conductance material 54 as herein used particularly in reference to FIGS. 13–15 (to be described below) is such material. Active element 14 is also pressure-sensitive variable-conductance material. Material having these qualities can be achieved utilizing various chemical compounds or formulas some of which I will herein detail for example. Additional information regarding such materials can be found in U.S. Pat. No. 3,806,471 issued to R. J. Mitchell describing various feasible pressure-sensitive variable-conductance material formulas which can be utilized.

While it is generally anticipated that variable resistive type materials for defining active element 14 or material 54 are optimum for use in pressure sensor(s), variable rectifying materials are also usable within the scope of the present invention.

An example formula or compound having variable rectifying properties can be made of any one of the active materials copper oxide, magnesium silicide, magnesium stannide, cuprous sulfide, (or the like) bound together with a rubbery or elastomeric type binder having resilient qualities such as silicone adhesive or the like.

An example formula or compound having variable resistive properties can be made of the active material tungsten carbide powder (or other suitable material such as molybdenum disulfide, sponge iron, tin oxide, boron, and carbon powders, etc.) bound together with a rubbery or elastomeric type binder such as silicone rubber or the like having resilient qualities. The active materials may be in proportion to the binder material typically in a rich ratio such as 80% active material to 20% binder by volume, but can be varied widely from this ratio dependant on factors such as voltages to be applied, level or resistance range desired, depressive pressure anticipated, material thickness of the active element, surface contact area between the variable-conductance material and conductive elements of the circuit, binder type, manufacturing technique and specific active material used. I have found that tungsten carbide powder bound with a rubbery or elastomeric type binder such as silicone rubber or the like provides a wider range of varying resistance than the typical carbon pill or active element 14 of the prior art dome-cap switches and thus may be preferred particularly for application requiring high resolution. Also, the tungsten carbide based active element is more predictable in it's pressure sensitive varying conductivity over a wider temperature range than the typical carbon based active element used in prior art dome-cap switches.

Figure 13:
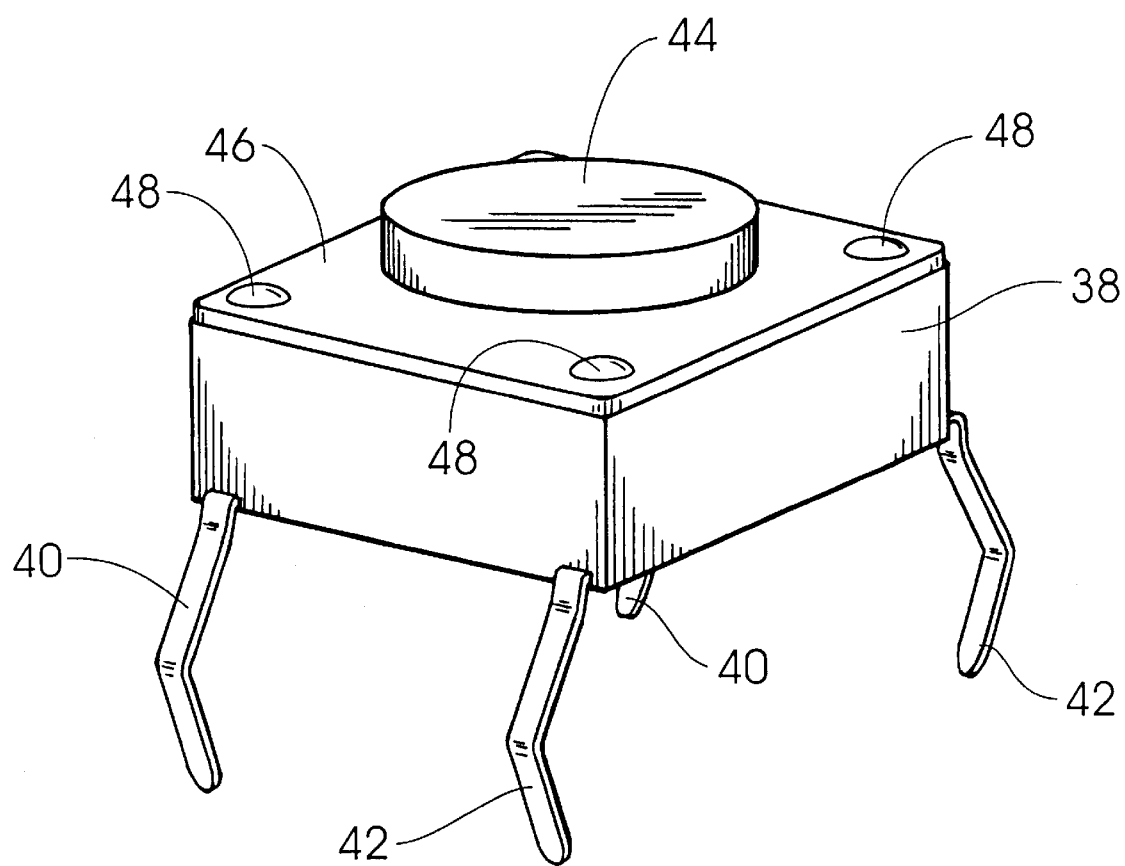
FIG. 13 shows a flat mount sensor or switch package which is structured in a novel manner inside the sensor.
Figure 14:
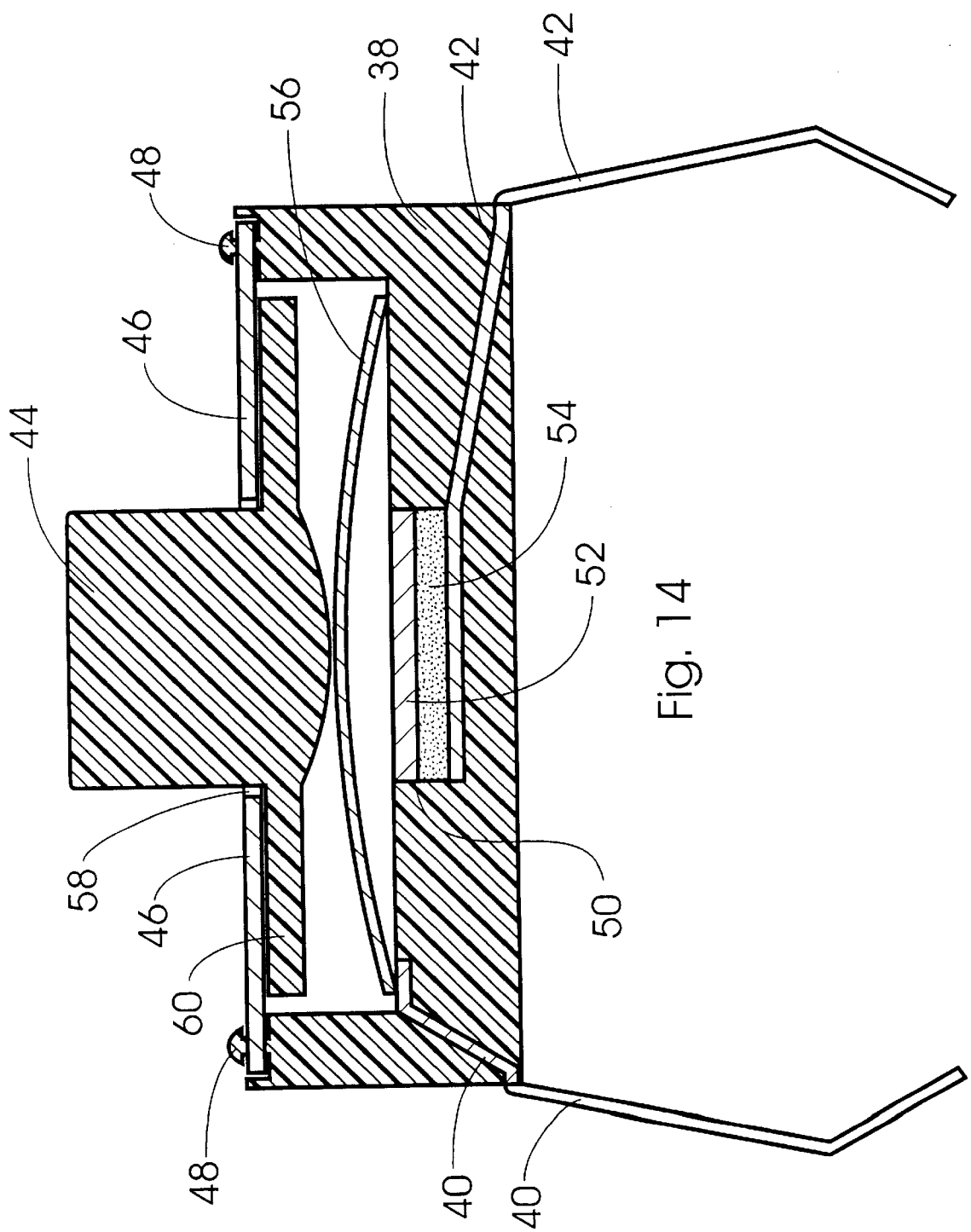
FIG. 14 shows a median cross section view of the FIG. 13 flat mount sensor package structured to be a pressure-sensitive variable-conductance sensor and useful with the present invention.

FIG. 13 shows a flat mount sensor package which outwardly appears as many prior art switches or sensors. An analog sensor used in the present invention can also appear as shown in FIG. 13. The sensor of FIG. 13 as will be shown in FIG. 14 is a novel analog sensor capable of variable conductance through at least three readable states, and such a sensor is not known to exist in the prior art. The analog sensor of FIGS. 13–15 can be used in a remote controller in accordance with the present invention. FIG. 13 shows four extensions external of housing 38 which those skilled in the art understand in regards to prior art switch packages are in effect two conductive elements 40, 42 wherein two of the extensions represent portions of first conductive element 40 external to housing 38, and the other two extensions represent portions of second conductive element 42; as is common in many prior art switch packages for allowing increased strength and options in mechanical and electrical connecting, and such multi-extensions external of housing 38 for each conductive element 40, 42 can also be used on sensors used with the present invention. Housing 38 is typically of non-conductive plastics, and the two conductive elements 40 and 42 are typically highly conductive and of fairly constant conductivity; the conductive elements 40, 42 each fixed to housing 38 and in-part within housing 38 and in-part exposed external of housing 38. Conductive elements 40, 42 are herein sometimes referred to as first conductive element 40 and second conductive element 42, and are typically formed via stamping and bending of sheet metal. Typically, housing 38 is of non-conductive plastics molded around portions of conductive elements 40 and 42 so as to retain the conductive elements in proper location to housing 38. Also shown in FIG. 13 is a housing closing plate 46 and retaining studs 48 at the corners for retaining plate 46 on the balance of housing 38, and a depressible actuator 44 extending from within housing 38 through an opening in plate 46.

FIG. 14 shows a median cross section view of the sensor package of FIG. 13 and showing pressure-sensitive variable-conductance material 54 within a recess or well 50 inside housing 38 contacting second conductive element 42 and capped by an optional conductive cap 52. The FIG. 14 sensor includes the optional conductive cap 52, which can be used to define a lamination of pressure-sensitive variable-conductance material 54 onto conductive sheet material and then cut-out with a hole punch prior to insertion in to the well 50 of the housing of the sensor package. Conductive cap 52 being atop pressure-sensitive variable-conductance material 54 is effectively closing pressure-sensitive variable-conductance material 54 within well 50. Conductive cap 52 should either be flexible so as to be able to bow into pressure-sensitive variable-conductance material 54, or loose fit in well 50 so as to be able to move in it's entirety into pressure-sensitive variable-conductance material 54 when pressure is applied thereto by snap-through dome-cap 16 to be detailed. Conductive elements 40, 42, are shown separated from one another within housing 38 and in a normally open state or circuit, being separated by space and the insulating material defining housing 38. An end portion of first conductive element 40 within housing 38 is shown positioned in constant contact with a side edge of dome-cap 56. Dome-cap 56 is a circular resilient disk having a domed or concavo-convexed shape and typically made of electrically conductive metal. Dome-cap 56 is shown positioned within a large recess or the interior open space defined by housing 38 and between depressible actuator 44 and conductive elements 40, 42. As shown in FIG. 15, in this sensor embodiment, depression of actuator 44 sufficiently causes dome-cap 56 to bow downward causing a center portion of dome-cap 56 to contact conductive cap 52. If cap 52 is not used, dome-cap 56 would contact material 54 directly. Well 50 is also optional. The contacting of the center portion of dome-cap 56 with conductive cap 52 causes an electrical bridging or closing between conductive elements 40, 42 through pressure-sensitive variable-conductance material 54, conductive cap 52 and conductive dome-cap 56, the degree of conductivity determined by the degree, level or amount of pressure applied to pressure-sensitive variable-conductance material 54 by way of pressure applied to actuator 44, and thus at least three readable states can readily be obtained with this packaged analog sensor embodiment. Dome-cap 56 when pressed against by way of depressive pressure applied to actuator 44 bows toward conductive cap 52 with a degree of resistance to moving, the resistance begins relatively low and increases toward a snap-through threshold wherein at the snap-through threshold dome-cap 56 "snaps-through" and moves further downward. A snap or click (tactile sensation) can be felt and in some applications heard (user discernable tactile feedback) as dome-cap 56 snaps-through its threshold. The snap-through dome-cap 56 being of resilient design, returns to a raised position off of conductive cap 52 when actuator 44 is no longer depressed, and thus the sensor is a momentary-on analog type sensor capable of outputs of many different readable states. Also, the resiliency of the metal dome-cap 56 is used as the return spring for depressible actuator 44, holding the actuator 44 raised or outward when not depressed by an external force such as a human finger. Depressible actuator 44 is shown protruding through opening 58 in plate 46, and is prevented from passing completely through opening 58 by a flange 60 connected to actuator 44 and too large to pass through opening 58. The portion of depressible actuator 44 which is external of housing 38 can be of numerous sizes, shapes and lengths, for example to accommodate the attachment of or contacting of extending and/or enclosing members such as buttons, or to serve directly as a surface against which a finger can be applied to depress the actuator 44.

FIG. 15 shows a median cross section view of the embodiment of FIG. 14 with actuator 44 depressed, such as it would be by a user's finger or thumb, to such a degree as to cause dome-cap 56 to impinge upon conductive cap 52 atop the pressure-sensitive variable-conductance material 54. The pressure applied to conductive cap 52 is transferred in pressure-sensitive variable-conductance material 54 and the conductance between circuit elements 40 and 42 is varied upon varied compressive pressure on material 54. Numerous variations of the analog sensor of FIGS. 13–15 structure can be made, and such analog sensors can be used in a remote controller in accordance with the invention which also uses elastomeric dome-cap sensors. Circuit elements 40 and 42 solder or otherwise electrically connected to circuitry of the remote controller, such as the circuitry of circuit board 09 allowing the packaged analog sensor to interface with the circuitry and electronics of the remote controller 01 or 06.

FIGS. 16–18 show a top view of two conductive elements 16, 18 in various proximal arrangements as they may be applied in sensor embodiments useful with the present invention, particularly elastomeric dome-cap sensors wherein the active element 14 (or material 54) spans the two proximal conductive circuit elements 16, 18 to bridge the elements which are extensions of the circuitry of a circuit board such as discussed above in regards to circuit board 09. In this arrangement with circuit elements 16, 18, aligned to engage active element 14, the elastomeric dome-cap sensor electrically interfaces with the associated circuitry of the circuits of circuit board 09. A human digit, i.e., finger or thumb, can interface with the sensor as a whole by pressing, and with different amounts of force, the button surface of the button associated with the balance of the sensor, and thus interface with the circuitry of the remote controller for user selection of function-control signals to be emitted to host device 02. FIG. 16 shows two conductive elements 16, 18 as two side-by-side plate-like pads. FIG. 17 shows two conductive elements 16, 18 as two side-by-side pads having opposed fingers. FIG. 18 shows two conductive elements 16, 18 as two side-by-side pads defined by interdigitated fingers.

Figure 19:
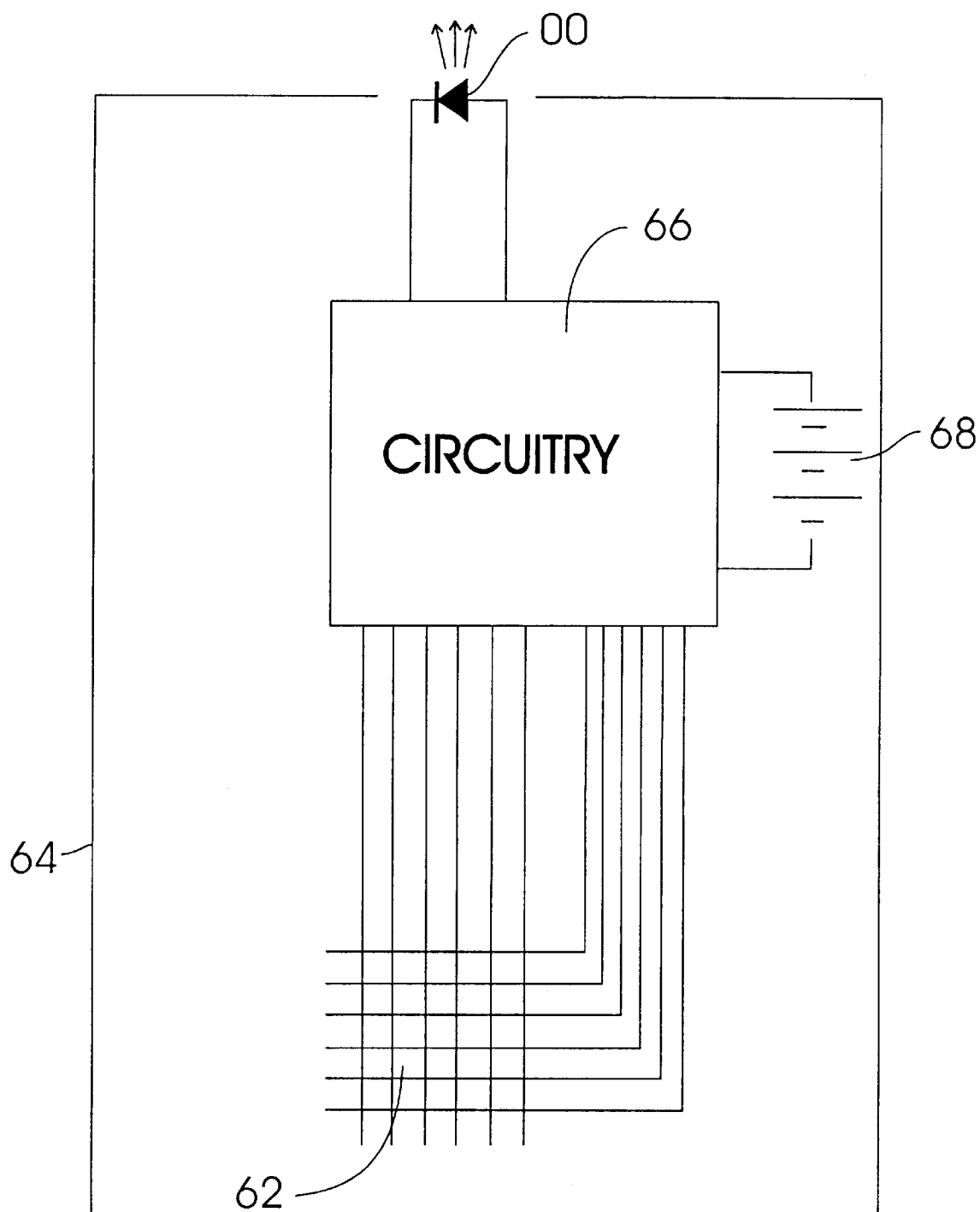
FIG. 19 is illustrative of some basic components of a prior art hand-holdable remote controller.

FIG. 19 is illustrative of some basic components of a prior art hand-holdable remote controller including a keypad 62, housing 64, circuitry 66 connected to an emitter 00, a battery 68 connected to the circuitry 66. Typically, as in the prior art, keypad 62 is a grid of electrical conductors formed in a row and column pattern connected to circuitry 66 and including at the junction of each row and column is a momentary-On only On/Off switch typically associated with a depressible button for each switch. The circuitry is commonly an ASIC chip (application specific integrated circuit) or microcontroller in a surface mount or a COB package (chip on board) or the like.

Figure 20:
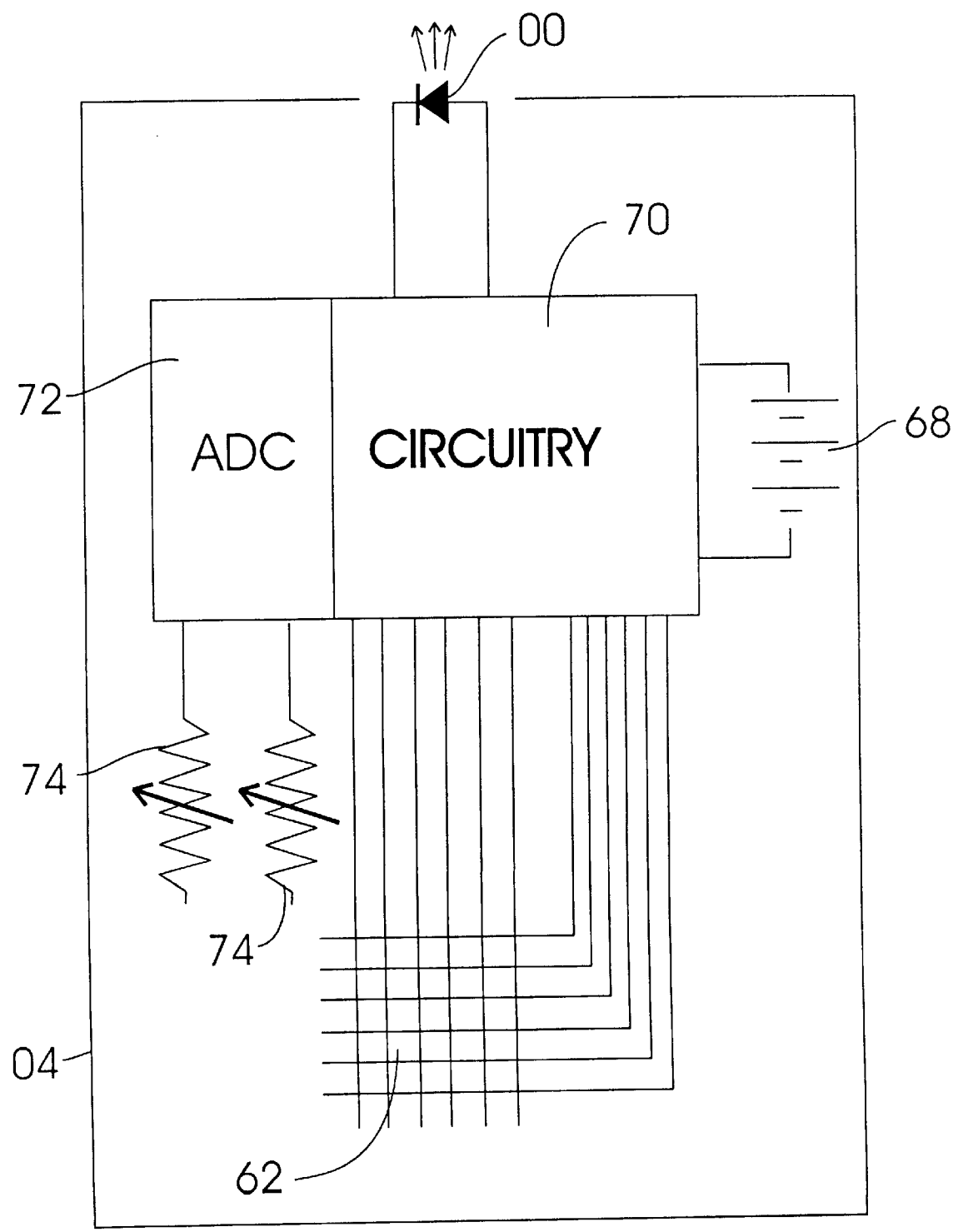
FIG. 20 is illustrative of some basic components of a hand-holdable remote controller in accordance with the present invention.

FIG. 20 is illustrative of some basic components of a hand-holdable remote controller in accordance with the present invention and including a keypad 62, housing 04, a battery 68, emitter 00, circuitry 70 having an additional circuitry 72 for reading pressure-sensitive variable-conductance material 54 or active element 14 of a sensor such as a pressure-sensitive variable-conductance depressible button sensor as shown in FIGS. 7, 9, 12 or 13–15 and indicated as variable resistors 74 in the drawing. Circuitry 70 shows additional circuitry 72 for reading the analog state or value of variable resistors 74. Analog-to-digital conversion circuitry is well known in the prior art, and is typically achieved either within the microcontroller or ASIC chip by dedicated internal ADC hardware, or it is achieved external to the chip such as by charging a capacitor through a variable resistor and measuring the time required to charge the capacitor as a function of immediate resistance of the variable resistor. While analog-to-digital conversion is commonly known, it is not commonly used in remote controllers and is not known to ever have been used with an analog depressible button format in a remote controller as herein taught. In use, the user depresses a button 03 (FIG. 1, 2, 6) associated with variable resistor 74 and the state or level of depressive pressure exerted by the user's finger or thumb is read by ADC circuitry 72, and formatted by circuitry 70 into a signal representing a read state and emitted by emitter 00 as a complete function-control signal indicating which sensor has been activated and to what extent. While FIG. 20 only shows to variable sensors 74, one or many such depressible analog button sensors could clearly be applied in like manner.

In FIG. 20 the two variable resistors 74, i.e., analog depressible button sensors, can represent a channel-up and a channel-down set of buttons for channel tuner control, or video speed forward or video speed in reverse control set of buttons such as on a VCR or DVD, or audio speed forward or audio speed in reverse control set of buttons such as on an audio playback device.

Figure 21:
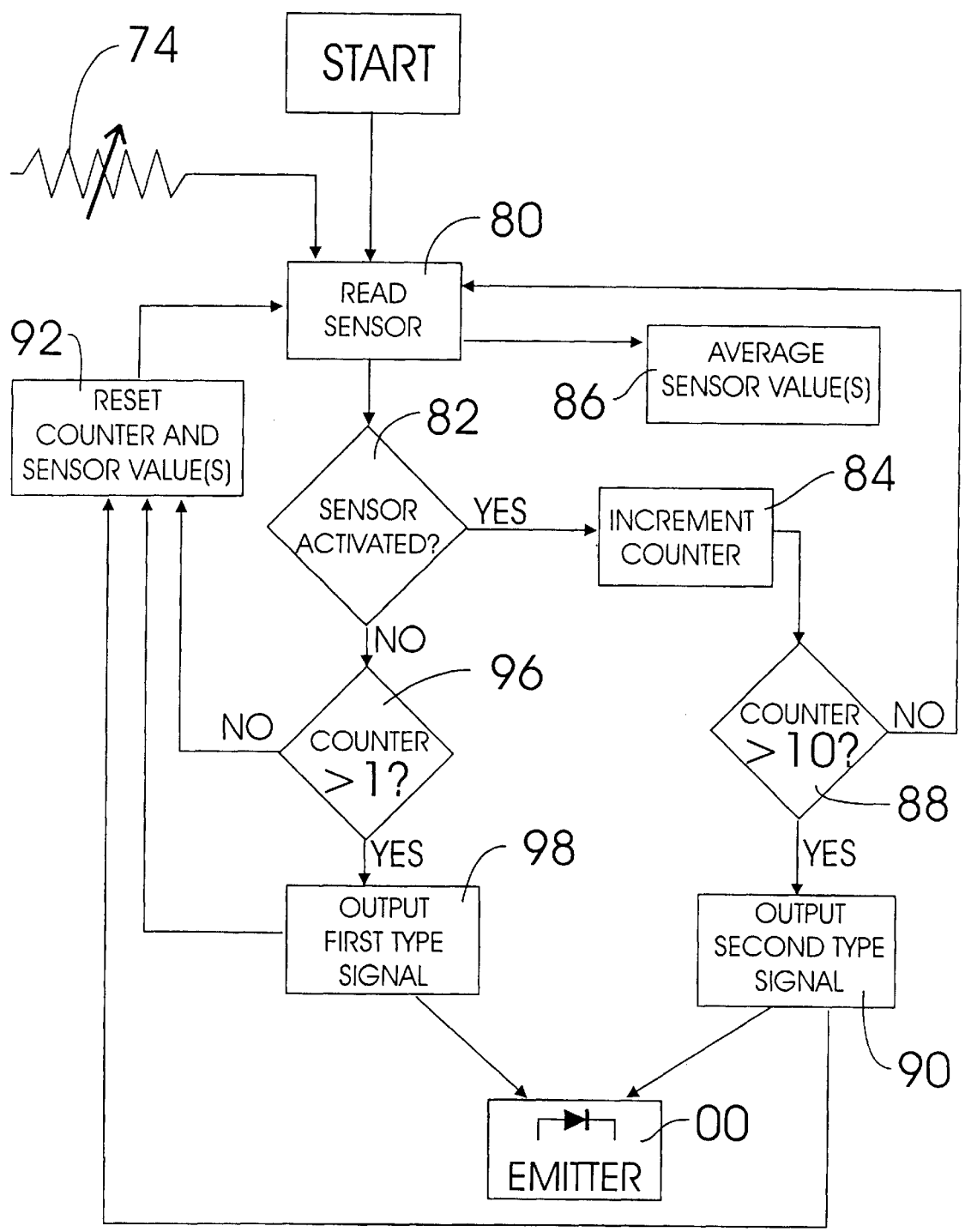
FIG. 21 shows a pressure-sensitive variable-conductance depressible button sensor such as the dome-cap sensors of FIGS. 7 or 9, or the package sensor of FIGS. 13–15 and indicated as a variable resistor connected in a battery powered circuit including a counter with analog-to-digital conversion circuitry for storing and outputting digital information such as could be used with a dual role pressure-sensitive variable-conductance depressible button sensor in an improved remote controller in accordance with the present invention.

FIG. 21 being primarily regarding the "dual role" of the analog sensors in a remote controller as mentioned above. Shown is a simplified flow chart, for example only, representing a program element for reading a single analog sensor and determining whether the output caused by a variable input depressible button will be either a first signal type such as an only On/Off signal type, or a second signal type such as a variable signal representative of differing levels of depressive pressure applied, both signal types being generated from a singular button on the remote controller housing, the button associated with a pressure-sensitive variable-conductance sensor for varying conductance through at least three readable states, and preferably many more states.

The flow chart demonstrates that the program first looks at variable resistor 74 of the sensor and reads 80 the sensor's current state. The program flow control then goes to decision 82 based on the question "is the sensor activated?" If the sensor is activated, a counter is incremented 84 indicating that the sensor has been read as activated. Additionally the sensor state or value is stored in a storage register(s) and averaged 86 (or equivalent) with any other previous read values. The counter value is read, and a decision 88 is made depending on the counter value, if the counter value is not sufficiently high, for example, ten reads of the sensor, then the sensor is read 80 again. If the counter value is sufficiently high, then the button has been held sufficiently long, for example, ¼ of a second or longer, and the second type signal is output 90 to emitter 00 transmitting signal(s) representing the level of depressive pressure applied to the button and analog sensor 74. The counter and storage register(s) are then is cleared or reset 92. On the branch in which a first type signal would be output, at decision 82 "is the sensor activated?" if the answer is no, then the counter value is examined 96, if the counter value is not of a sufficient value, for example, at least more than one, then any previously stored sensor activation is considered spurious and discarded, the counter and storage values are reset 92 and the sensor is read 80 again. On the other hand, at decision 96, if the counter value is greater than one for example, then the button is deemed to have been pressed and immediately released so the first type signal is output 98 to emitter 00, the counter and storage register(s) are then reset, and the sensor is read 80 again. Thus, the dual role sensor output offers advantage in for example, channel switching wherein a channel may be incremented by a quick press and release, and channels may be scrolled at a desired speed by continuous user selected depressive pressure on a button of the remote controller. Likewise for control of video streaming and the like.

From the drawings and above details it should be appreciated that the present invention can readily be described in numerous ways including the following descriptions provided for the sake of positive clarity and which reiterate certain details, provide, expand on and combine other details.

For example, the invention from one view point is an improved hand-holdable remote controller for controlling a host device, the remote controller of the type including a housing, an electrical power source within the housing, electronic circuitry within the housing connected to the power source and including an emitter positioned to emit function-control signals from the housing, a plurality of finger depressible buttons exposed on the housing and interfacing with sensors electrically associated with the circuitry for allowing user selection of function-control signals emitted for controlling a host device; a plurality of the sensors read by the circuitry as sensors having only two readable states;

wherein the improvements comprise:

at least one of the sensors structured as a pressure-sensitive variable-conductance sensor to provide at least three readable states of varied conductance, the states dependant upon depressive pressure applied to the variable-conductance sensor;

the circuitry including means, e.g., circuit conductors connected to electronic components such as a digital-to-analog converter coupled to a data storage register and emitter 00, for reading the at least three readable states and for emitting distinct function-control signals for each of at least two states of the at least three readable states.

The invention from another view point is an improved hand-holdable remote controller for controlling a host device, the remote controller of the type including a housing, an electrical power source within the housing, electronic circuitry within the housing connected to the power source and including an emitter positioned to emit function-control signals from the housing, a plurality of finger depressible buttons exposed on the housing and interfacing with sensors electrically associated with the circuitry for allowing user selection of function-control signals emitted for controlling a host device;

wherein the improvements comprise:

at least two of the sensors each structured to provide at least three readable states of varied conductance, the states dependant upon depressive pressure applied individually to the sensors of the at least two sensors;

the circuitry including means, e.g., circuit conductors connected to electronic components such as a digital-to-analog converter coupled to data storage registers and emitter 00, for reading the at least three readable states and for emitting function-control signals representative of each of at least two states of the at least three readable states;

a first sensor of the at least two sensors, the first sensor associated with a first button of the finger depressible buttons, the first button variably depressible to allow applying varied depressive pressure to the first sensor, the first sensor associated with means, e.g., the analog-to-digital converter coupled to a particular sector of the data storage register, of the circuitry for reading the at least three readable states and emitting tuner channel-up selecting type of the function-control signals;

a second sensor of the at least two sensors, the second sensor associated with a second button of the finger depressible buttons, the second button variably depressible to allow applying varied depressive pressure to the second sensor, the second sensor associated with means, e.g., the analog-to-digital converter coupled to a particular data storage register, of the circuitry for reading the at least three readable states and emitting tuner channel-down selecting type of the function-control signals. More narrowly, wherein the first and second sensors are each elastomeric dome-cap sensors each including a pressure-sensitive variable-conductance material positioned over proximal conductive circuit elements of the circuitry.

From yet another view point, the invention is an improved hand-holdable remote controller for controlling a host device, the remote controller of the type including a housing, an electrical power source within the housing, electronic circuitry within the housing connected to the power source and including an emitter positioned to emit function-control signals from the housing, a plurality of finger depressible buttons exposed on the housing and interfacing with sensors electrically associated with the circuitry for allowing user selection of function-control signals emitted for controlling a host device; a plurality of the sensors read by the circuitry as sensors having only two readable states;

wherein the improvements comprise:

at least one of the sensors structured as a pressure-sensitive variable-conductance sensor for varying conductance through at least three readable states, the states dependant upon depressive pressure applied to an associated finger depressible button; and the circuitry structured for reading any one state of the at least three readable states, and for emitting by the emitter a first signal type and a second signal type, emission of either one of the signal types determined by an amount of time of depression of the button, and the second signal type further including a signal representative of the level of depressive pressure applied to the button.

From another view point, the invention is an improved method of controlling a host device using a hand-held remote controller, the controller of the type including a housing, an electrical power source within the housing, electronic circuitry within the housing connected to the power source and including a radiation emitter positioned to emit radiation from the housing, a plurality of finger depressible buttons exposed on the housing and interfacing with sensors electrically associated with the circuitry for allowing user selection of function-control signals emitted as radiation by the radiation emitter for controlling a host device; at least some of the sensors being only ON/Off sensors, the controller further of the type wherein a-user depresses any one of the buttons to activate a related singular function-control signal, and releases the button to deactivate the function-control signal;

wherein the improvement comprises:

depressing,.by the user, one of the buttons with any user selectable pressure level of a plurality of user selectable pressure levels, the depressing of the button for activating one function-control signal of a plurality of activatable function-control signals associated with the button, whereby the user selects function-control signals associated with the button by way of selecting the pressure applied to the button. More narrowly, wherein the host device is a tuner for channel changing, and the method further comprises manipulating channel change rate by selecting any the user selectable pressure level of the plurality of user selectable pressure levels associated with the button, and further, wherein manipulating of channel change rate is such that channel change rate increases with increasing pressure applied to the button. Alternatively, wherein the host device is a recorded video player, and the method further comprises manipulating video play rate by selecting any the user selectable pressure level of the plurality of user selectable pressure levels associated with the button.

Alternatively, wherein the host device is a recorded audio player, and the method further comprises manipulating audio play by selecting any the user selectable pressure level of the plurality of user selectable pressure levels associated with the button.

From another view point, the invention is a method of manufacturing an improved hand-held remote controller including the known prior art steps of: molding a housing; installing means for receiving a power source, e.g., battery socket, within the housing; installing electronic circuitry within the housing and connected to the means for receiving the power source; connecting a radiation emitter to the circuitry and positioned to emit radiation from the housing; installing a plurality of finger depressible buttons with sensors electrically associated with the circuitry; the circuitry for reading a plurality of the sensors as sensors having only two readable values; and further including the novel combined steps of:
installing pressure-sensitive variable-conductance sensors activated by depression of the depressible buttons, the variable-conductance sensors structured to provide at least three readable values, the values dependant upon depressive pressure applied to the depressible buttons;
installing circuitry for reading an immediate value of the at least three readable values of the pressure-sensitive variable-conductance sensors, and for outputting from the emitter data representative of the immediate value, whereby the improved remote controller is manufactured for outputting data representative of the depressive pressure applied to the depressible buttons.

From another view point, the invention is a method of manufacturing an improved hand-held remote controller including the known prior art steps of: molding a housing; installing means for receiving a power source, e.g., battery socket, within the housing; installing electronic circuitry within the housing and connected to the means for receiving the power source, e.g., battery socket; connecting a radiation emitter to the circuitry and positioned to emit radiation from the housing; installing a plurality of finger depressible buttons with sensors electrically associated with the circuitry; the circuitry for reading a plurality of the sensors as sensors having only two readable values; and installing pressure-sensitive variable-conductance sensors activated by depression of the depressible buttons, the variable-conductance sensors structured to provide at least three readable values, the values dependant upon depressive pressure applied to the depressible buttons; and further including the novel step of:
installing circuitry for reading a current, instant or immediate value of the at least three readable values of the pressure-sensitive variable-conductance sensors, and for outputting from the emitter data representative of the current value, whereby the improved remote controller is manufactured for outputting data representative of the depressive pressure applied to the depressible buttons, the depressive pressure being variable by the human user for varying the output data.

Although I have very specifically described the preferred structures and best modes of the invention, it should be understood that the specific details are given for example to those skilled in the art. Changes in the specific structures described and shown may clearly be made without departing from the scope of the invention, and therefore it should be understood that the scope of the invention is not to be overly limited by the specification and drawings given for example, but is to be determined by the broadest possible and reasonable interpretation of the appended claims.

I claim:

1. An improved hand-hold-able remote controller structure for controlling a host device, said remote controller of the type including a housing, an electrical power source, electronic circuitry within said housing connected to said power source and including an emitter for emitting function-control signals from said housing, a plurality of finger depressible buttons exposed on said housing and interfacing with sensors electrically associated with said circuitry for allowing user selection of function-control signals emitted for controlling a host device; at least one of said sensors including a depressible dome-cap member and a pressure-sensitive variable-conductance analog material capable of providing at least three readable states of varied conductance, said states dependant upon depressive pressure applied to tho variable-conductance analog material through depression of at least one of said finger depressible buttons against the dome-cap member;

wherein the improvement comprises:
said circuitry including means for reading said at least three readable states said variable-conductance analog material and for emitting distinct function-control signals for each of at least two states of said at least three readable states,
wherein, the user selects any of the selectable pressure levels, of a plurality of selectable pressure levels.

2. An improved hand-holdable remote controller structure for controlling a host device according to claim 1 further including the dome-cap member comprising elastomeric material in dome shape positioned over said variable-conductance analog material.

3. An improved hand-holdable remote controller structure for controlling a host device according to claim 1 wherein said change rate function-control signals are signals for available channel scrolling.

4. An improved hand-holdable remote controller structure for controlling a host device according to claim 1 further including the dome-cap member comprising elastomeric material in dome shape and carrying said variable-conductance analog material positioned above proximal conductive elements.

5. An improved hand-holdable remote controller structure for controlling a host device according to claim 1 wherein said host device is a video playback device and said distinct function-control signals for each of at least two states are video speed function-control signals, whereby video speed can be varied in rate by varied pressure applied to said variable-conductance analog material.

6. An improved hand-holdable remote controller structure for controlling a host device according to claim 5 wherein the video playback device is a digital video disk player, the playback rate of which is controllable by said remote controller structure.

7. An improved hand-holdable remote controller structure for controlling a host device according to claim 1 further including the variable-conductance analog material capable of providing at least nine readable states of varied conductance, said states dependant upon pressure applied to the variable-conductance analog material, and further wherein said circuitry includes means for reading said at least nine readable states of said variable-conductance analog material.

8. An improved hand-holdable remote controller structure for controlling a host device according to claim 7 further including said dome-cap member comprising elastomeric material positioned over said variable-conductance analog material, and further wherein said distinct function-control signals comprise video speed function-control signals for controlling the playback rate of a video playback host device.

9. An improved hand-holdable remote controller structure for controlling a host device according to claim 1 further including the dome-cap member comprising electrically conductive material over said variable-conductance analog material.

10. An improved hand-holdable remote controlled structure for controlling a host device according to claim 9 further including the electrically conductive material of the dome-cap member being metal, and the dome-cap member providing a portion of an electrical circuit through said variable-conductance analog material, and the dome-cap member is further structured to provide a user discernable tactile feedback upon depression of the dome-cap.

11. An improved hand-hold-able remote controller for controlling a host device, said remote controller of the type including a housing, an electrical power source, electronic circuitry within said housing connected to said power source and including means for outputting function-control signals from said housing, a plurality of finger depressible buttons exposed on said housing and interfacing with sensors electrically associated with said circuitry for allowing user selection of function-control signals output for controlling a host device; a plurality of said sensors read by said circuitry as sensors having only two readable states;

wherein the improvements comprise:
at least one of said sensors structured as a pressure sensitive variable-conductance analog sensor to provide at least three readable states of varied conductance, said states dependant upon depressive pressure applied to the variable conductance analog sensor;
said circuitry including means for reading said at least three readable states and for outputting distinct function-control signals for each of at least two states of said at least three readable-states,
wherein, the user selects any of the selectable pressure levels, of a plurality of selectable pressure levels.

12. An improved hand-holdable remote controller for controlling a host device according to claim 11 wherein said host device includes a tuner for channel changing and said distinct function-control signals for each of at least two states are available channel change rate function-control signals, whereby the available channels selectable by the tuner can be scrolled at varied rates determined by varied pressure applied to said variable-conductance analog sensor through depression of said button.

13. An improved hand-holdable remote controller for controlling a host device according to claim 11 further including a dome-cap member in dome shape positioned over pressure-sensitive variable-conductance material of the variable-conductance analog sensor.

14. An improved hand-holdable remote controller for controlling a host device according to claim 13 wherein said host device is a video playback device and said distinct function-control signals for each of at least two states are video speed function-control signals, whereby video speed can be varied in rate by varied pressure applied to said variable-conductance analog sensor.

15. An improved hand-holdable remote controller for controlling a host device according to claim 14 wherein the video playback device is a digital video disk player controlled by said remote controller.

16. An improved hand-holdable remote controller for controlling a host device according to claim 11 further including the variable-conductance analog sensor structurally arranged of providing at least nine readable states, said states dependant upon pressure applied to the variable-conductance analog sensor, and further wherein said circuitry includes means for reading said at least nine readable states.

17. An improved hand-holdable remote controller for controlling a host device according to claim 16 further including a dome-cap member comprising elastomeric material positioned over pressure-sensitive variable-conductance material of the variable-conductance analog sensor, and further wherein said distinct function-control signals comprise video speed function-control signals for controlling the playback rate of a video playback host device.

18. An improved hand-holdable remote controller for controlling a host device according to claim 17 further including the dome-cap member structured to provide a user discernable tactile feedback upon depression of the dome-cap.

19. An improved hand-hold-able remote controller for controlling a host device, said remote controller of the type including a housing, an electrical power source, electronic circuitry within said housing connected to said power source and including an emitter positioned to emit function-control signals from said housing, a plurality of finger depressible buttons exposed on said housing and interfacing with sensors electrically associated with said circuitry for allowing user selection of function-control signals emitted for controlling a host device;

wherein the improvements comprise:
at least two of said sensors each structured to include pressure sensitive variable-conductance analog material to provide at least three readable states of varied conductance from each sensor of said at least two of said sensor, said states dependant upon depressive pressure applied individually to the sensors of said at least two of said sensors;
said circuitry including means for reading said at least three readable states and for emitting function-control signals representative of each of at least two states of said at least three readable states;
a first sensor of said at least two of said sensors, said first sensor associated with a first button of said finger depressible buttons, said first button variably depressible to allow applying varied depressive pressure to said first sensor, said first sensor associated with means of said circuitry for reading said at least three readable states and emitting tuner channel-up selecting type of said function-control signals;
a second sensor of said at least two of said sensors, said second sensor associated with a second button of said finger depressible buttons, said second button variably depressible to allow applying varied depressive pressure to said second sensor, said second sensor associated with means of said circuitry for reading said at least three readable states and emitting tuner channel-down selecting type of said function-control signals,
wherein, the user selects any of the selectable pressure levels, of a plurality of selectable pressure levels.

20. An improved hand-holdable remote controller in accordance with claim 19 wherein the first and second sensors each include a depressible dome-cap over proximal conductive circuit elements of said circuitry and further with the pressure-sensitive variable-conductance analog material positioned between the dome-cap and the proximal conductive circuit elements.

21. An improved hand-hold-able remote controller for controlling a host device, said remote controller of the type including a housing, an electrical power source, electronic circuitry within said housing connected to said power source and including an emitter positioned to emit function-control signals outward as radiation from said housing, a plurality of finger depressible buttons exposed on said housing and interfacing with sensors electrically associated with said circuitry for allowing user selection of function-control signals emitted for controlling a host device; a plurality of said sensors read by said circuitry as sensors having only two readable states;

wherein the improvements comprise:
at least one of said sensors structured as a pressure sensitive variable-conductance analog sensor for varying conductance through at least three readable states, said states dependant upon depressive pressure applied to an associated finger depressible button; and
said circuitry structured for reading any one state of said at least three readable states, and for emitting by said emitter
a first signal type and
a second signal type, emission of either one of the signal types determined by an amount of time of depression of said button, and said second signal type further including a signal representative of a depressive level of depressive pressure applied to said button,
wherein, the user selects any of the selectable pressure levels, of a plurality of selectable pressure levels.

22. An improved method of controlling a host device using a hand-held remote controller, the controller of the type including a housing, an electrical power source, electronic circuitry within said housing connected to said power source and including a radiation emitter positioned to emit radiation from said housing, a plurality of finger depressible buttons exposed on said housing and interfacing with sensors electrically associated with said circuitry for allowing user selection of function-control signals emitted as radiation by said radiation emitter for controlling a host device; at least some of said sensors being read by said circuitry as only ON/Off sensors wherein a user depresses any one of said buttons associated with the read as only ON/OFF sensors to activate a related singular function-control signal, and releases the button to deactivate said singular function-control signal; at least some of the sensors are analog capable containing pressure-sensitive variable-conductance material capable of outputting at least three readable values dependant upon applied pressure;

wherein the improvement comprises:
depressing, by the user, one of said buttons associated with an analog capable sensor with a first level of user selectable pressure of a plurality of user selectable pressure levels, said depressing of said button for activating a first change rate function-control signal of a plurality of activatable change rate function-control signals associated with said button, and then,
depressing, by the user, said one of said buttons with a second level of user selectable pressure different than said first level of pressure for activating a second change rate function-control signal associated with said button, whereby the user selects and activates change rate function-control signals associated with said button by way of selecting the pressure applied to said button.

23. An improved method of controlling a host device according to claim 22 wherein said host device is a recorded video player, and the method further comprises
changing video play rate by depressing said button and selecting a said user selectable pressure level of said plurality of user selectable pressure levels associated with said button.

24. An improved method of controlling a host device according to claim 22 wherein said host device is a recorded audio player, and the method further comprises
changing audio play by depressing said button and selecting any said user selectable pressure level of said plurality of user selectable pressure levels associated with said button.

25. An improved method of controlling a host device using a hand-held remote controller according to claim 22 further including channel changing of a tuner by depressing said one of said buttons with a user selected level of user selectable pressure for selecting a channel change rate of the tuner.

26. An improved method of controlling a host device using a hand-held remote controller according to claim 22 further including
depressing, by the user, said one of said buttons with a third level of user selectable pressure different than said first and said second levels of pressure for activating a third change rate function-control signal associated with said button.

27. An improved method of controlling a host device according to claim 26 wherein said host device is a device which plays recorded video wherein the rate of playback of the video is user determinable through user selectable pressure levels associated with said button.

28. An improved method of controlling a host device according to claim 27 wherein selection of playback rate is such that said playback rate is made to increase with increasing pressure applied to said button.

29. A method of manufacturing a hand-held remote controller including the steps of:
molding a housing, installing means for receiving a power source within said housing; installing electronic circuitry within said housing and connected to said means for receiving said power source installing a plurality of finger depressible buttons with sensors electrically associated with said circuitry;
installing a flexible dome-cap member as a component of at least one of said sensors:
installing pressure sensitive variable-conductance material under said flexible dome-cap member, said material positioned to be activated by depression of one of the depressible buttons, said variable-conductance material structurally arranged to provide at least three readable analog values, said values dependant upon depressive pressure applied to said one of the depressible buttons;

installing circuitry for reading an immediate value of said at least three readable analog values of the pressure-sensitive variable-conductance material, and for outputting from said controller, data representative of the immediate value, wherein, the user selects any of the selectable pressure levels, of a plurality of selectable pressure levels.

30. A method of manufacturing a hand-held remote controller according to claim 29 further including providing means for outputting from said controller, data representative of the immediate value as a tuner change and rate of change signal.

31. A method of manufacturing an improved hand-held remote controller according to claim 29 further including providing means for outputting from said controller, data representative of the immediate value as a video play speed signal.

* * * * *

(12) EX PARTE REEXAMINATION CERTIFICATE (7590th)
United States Patent
Armstrong

(10) Number: US 6,208,271 C1
(45) Certificate Issued: Jul. 6, 2010

(54) REMOTE CONTROLLER WITH ANALOG BUTTON(S)

(75) Inventor: Brad A. Armstrong, Paradise, CA (US)

(73) Assignee: Anascape, Ltd., Tyler, TX (US)

Reexamination Request:
No. 90/008,477, May 10, 2007

Reexamination Certificate for:
Patent No.: 6,208,271
Issued: Mar. 27, 2001
Appl. No.: 09/148,806
Filed: Sep. 4, 1998

(51) Int. Cl.
*H03K 17/96* (2006.01)
*H03K 17/94* (2006.01)

(52) U.S. Cl. .................... 341/34; 341/176; 341/22; 200/511; 345/159; 345/169

(58) Field of Classification Search .................. None
See application file for complete search history.

(56) References Cited

U.S. PATENT DOCUMENTS

| | | | |
|---|---|---|---|
| 4,489,302 | A | 12/1984 | Eventoff |
| 4,866,542 | A | 9/1989 | Shimada et al. |
| 5,164,697 | A | 11/1992 | Kramer |
| 5,377,173 | A | 12/1994 | Kim |
| 5,565,891 | A | 10/1996 | Armstrong |
| 6,004,210 | A | 12/1999 | Shinohara |

FOREIGN PATENT DOCUMENTS

| | | |
|---|---|---|
| JP | H1-62627 | 4/1989 |
| JP | H05-190051 | 7/1993 |
| JP | H05-87760 | 11/1993 |
| JP | H05-326217 | 12/1993 |
| JP | H06-056740 | 8/1994 |
| JP | H7-302159 | 11/1995 |
| JP | H08-222070 | 8/1996 |

*Primary Examiner*—Scott L. Weaver

(57) ABSTRACT

A remote controller for controlling a host device, the controller including a housing, an electrical power source within the housing, electronic circuitry within the housing connected to the power source and including a radiation emitter to emit signals from the housing, a plurality of finger depressible buttons exposed on the housing and interfacing with sensors electrically associated with the circuitry. The buttons are for user selection of signals emitted for controlling a host device. At least some of the sensors are utilized only as momentary-On only On/Off sensors. At least one sensor(s) is a pressure-sensitive analog sensor structured for varying electrical conductance through at least three readable states or values. The readable states are dependant upon depressive pressure applied to the sensor(s) through finger depressible button(s). The circuitry is structured to read the readable states of the pressure-sensitive analog sensor(s) and to emit signals representing the state or value of the sensor(s). In one embodiment, the analog sensor(s) is/are elastomeric dome-cap sensor(s) including pressure-sensitive variable-conductance material positioned over proximal circuit elements of the circuitry. The analog sensors are preferably associated with selectable functions such as tuner channel changing as for televisions and supportive tuner devices, and video speed controls as for VCRs, DVDs and like recorded video players, and computers and audio and other like devices. Additionally disclosed are methods of use and manufacture.

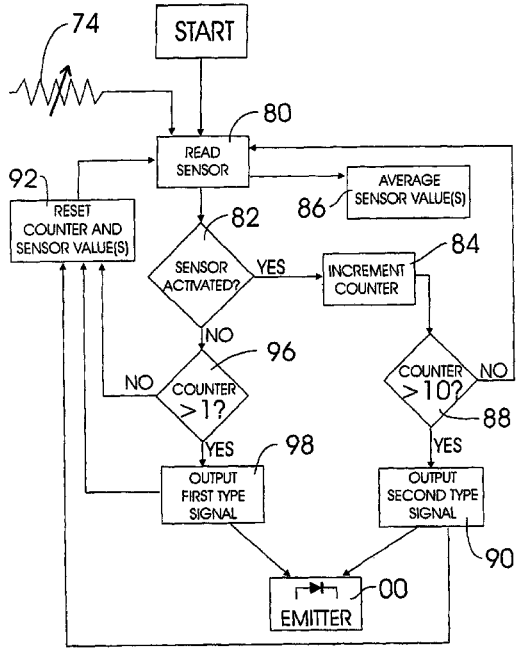

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-18 and 22-31 are cancelled.

Claims 19 and 21 are determined to be patentable as amended.

Claim 20, dependent on an amended claim, is determined to be patentable.

19. An improved hand-hold-able remote controller for controlling a host device, said remote controller of the type including a housing, an electrical power source, electronic circuitry within said housing connected to said power source and including an emitter positioned to emit function-control signals from said housing, a plurality of finger depressible buttons exposed on said housing and interfacing with sensors electrically associated with said circuitry for allowing user selection of function-control signals emitted for controlling a host device;
   wherein the improvements comprise:
      at least two of said sensors each structured to include pressure sensitive variable-conductance analog material to provide at least three readable states of varied conductance from each sensor of said at least two of said sensor, said states dependant upon depressive pressure applied individually to the sensors of said at least two of said sensors;
      said circuitry including means for reading said at least three readable states and for emitting function-control signals representative of each of at least two states of said at least three readable states;
      a first sensor of said at least two of said sensors, said first sensor associated with a first button of said finger depressible buttons, said first button variably depressible to allow applying varied depressive pressure to said first sensor, said first sensor associated with means of said circuitry for reading said at least three readable states and emitting tuner channel-up selecting type of said function-control signals;
      a second sensor of said at least two of said sensors, said second sensor associated with a second button of said finger depressible buttons, said second button variably depressible to allow applying varied depressive pressure to said second sensor, said second sensor associated with means of said circuitry for reading said at least three readable states and emitting tuner channel-down selecting type of said function-control signals,
      wherein, the user selects any of the selectable pressure levels, of a plurality of selectable pressure levels,
      *where a first degree of varying finger pressure on one of the first or second buttons controls a tuner to scroll towards a target channel at a first rate, and a second degree of varying finger pressure on the said one of the first or second buttons controls the tuner to scroll towards the target channel at a second rate, the second rate being lower than the first rate.*

21. An improved hand-hold-able remote controller for controlling a host device, said remote controller of the type including a housing, an electrical power source, electronic circuitry within said housing connected to said power source and including an emitter positioned to emit function-control signals outward as radiation from said housing, a plurality of finger depressible buttons exposed on said housing and interfacing with sensors electrically associated with said circuitry for allowing user selection of function-control signals emitted for controlling a host device; a plurality of said sensors read by said circuitry as sensors having only two readable states;
   wherein the improvements comprise:
      at least one of said sensors structured as a pressure sensitive variable-conductance analog sensor for varying conductance through at least three readable states, said states dependant upon depressive pressure applied to an associated finger depressible button; and
      said circuitry structured for reading any one state of said at least three readable states, and for emitting by said emitter
      a first signal type and
      a second signal type, emission of either one of the signal types determined by an amount of time of depression of said button, and said second signal type further including a signal representative of a depressive level of depressive pressure applied to said button,
      wherein, the user selects any of the selectable pressure levels, of a plurality of selectable pressure levels,
      *the function-control signals variably controlling, with respect to the host device, one of: a channel change scroll rate, a video playback rate, and an audio playback rate.*

* * * * *